United States Patent [19]

Inoue

[11] Patent Number: 5,697,192

[45] Date of Patent: *Dec. 16, 1997

[54] SOLAR CELL MODULE AND INSTALLATION METHOD THEREOF

[75] Inventor: Yuji Inoue, Nara, Japan

[73] Assignee: Canon Kabushiki Kaisha, Tokyo, Japan

[*] Notice: The term of this patent shall not extend beyond the expiration date of Pat. No. 5,480,494.

[21] Appl. No.: 703,471

[22] Filed: Aug. 27, 1996

Related U.S. Application Data

[62] Division of Ser. No. 520,560, Aug. 28, 1995, Pat. No. 5,583,057, which is a division of Ser. No. 240,891, May 11, 1994, Pat. No. 5,480,494.

[30] Foreign Application Priority Data

May 18, 1993 [JP] Japan ................................. 5-115613

[51] Int. Cl.$^6$ .................. E04D 13/18; H01L 31/048
[52] U.S. Cl. .................. 52/173.3; 136/251; 136/291
[58] Field of Search .................. 136/251, 291; 52/173.3

[56] References Cited

U.S. PATENT DOCUMENTS

| | | | |
|---|---|---|---|
| 4,773,944 | 9/1988 | Nath et al. | 136/249 |
| 5,092,939 | 3/1992 | Nath et al. | 136/251 |
| 5,232,518 | 8/1993 | Nath et al. | 136/251 |
| 5,252,141 | 10/1993 | Inoue | 136/251 |
| 5,480,494 | 1/1996 | Inoue | 136/251 |

FOREIGN PATENT DOCUMENTS

| | | | |
|---|---|---|---|
| 55-1115 | 1/1980 | Japan | 136/251 |
| 60-1875 | 1/1985 | Japan | 136/251 |

*Primary Examiner*—Aaron Weisstuch
*Attorney, Agent, or Firm*—Fitzpatrick, Cella, Harper & Scinto

[57] ABSTRACT

A solar cell module and an installation method thereof are disclosed. The solar cell module comprises an active solar cell element and a filler holding element disposed on said active solar cell element, said active solar cell element and said filler holding element being encapsulated with a filler between a transparent film and a reinforcing member, the solar cell module being characterized in that the reinforcing member, the filler, and the transparent film are bent in the direction opposite to the surface to be illuminated with the sunlight, wherein there is no filler holding element at least in the bent portion. The solar cell module arrangement in the above-described manner can be installed without degradation in conversion efficiency of the solar cell module. Furthermore, the total weight and total size including installation materials are very small.

22 Claims, 21 Drawing Sheets

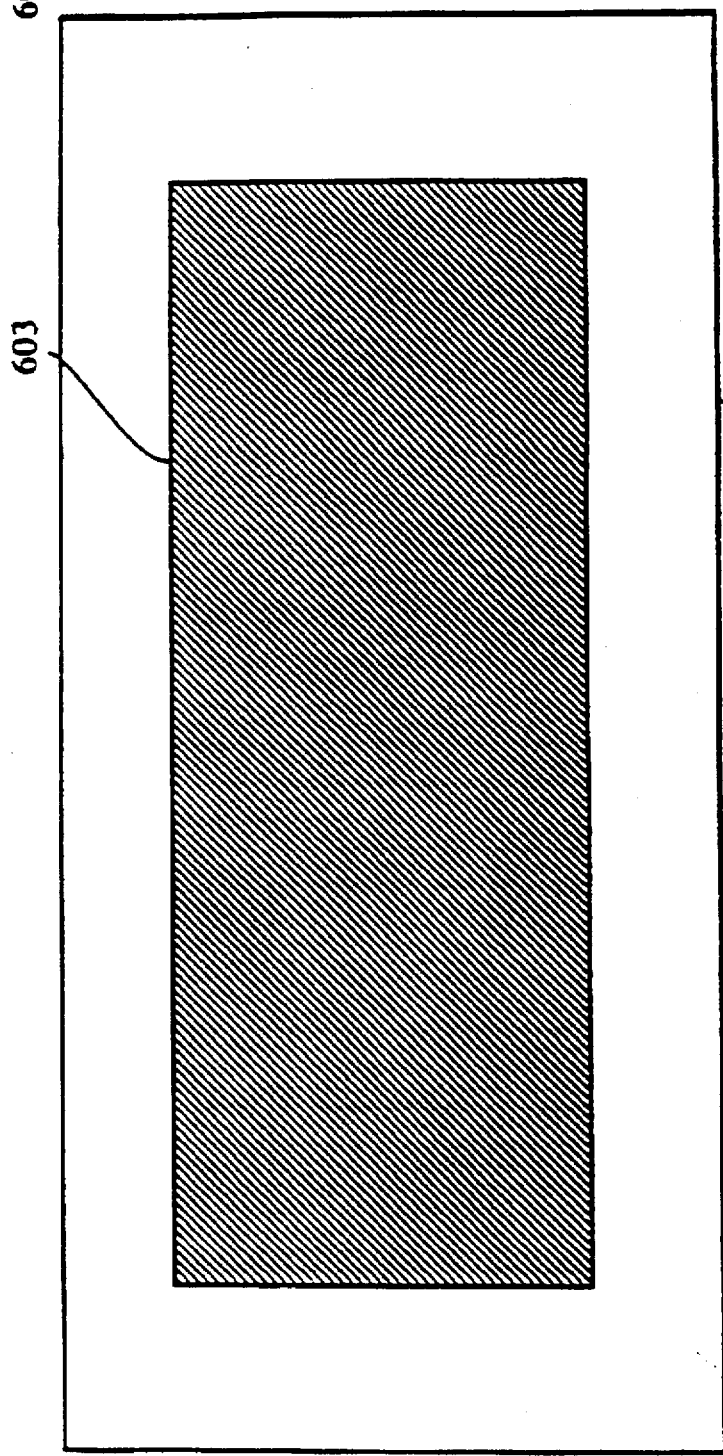
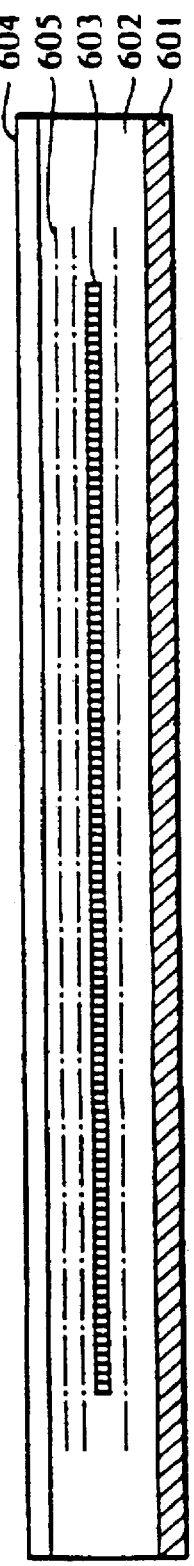
FIG. 6(a)
FIG. 6(b)
FIG. 6(c)

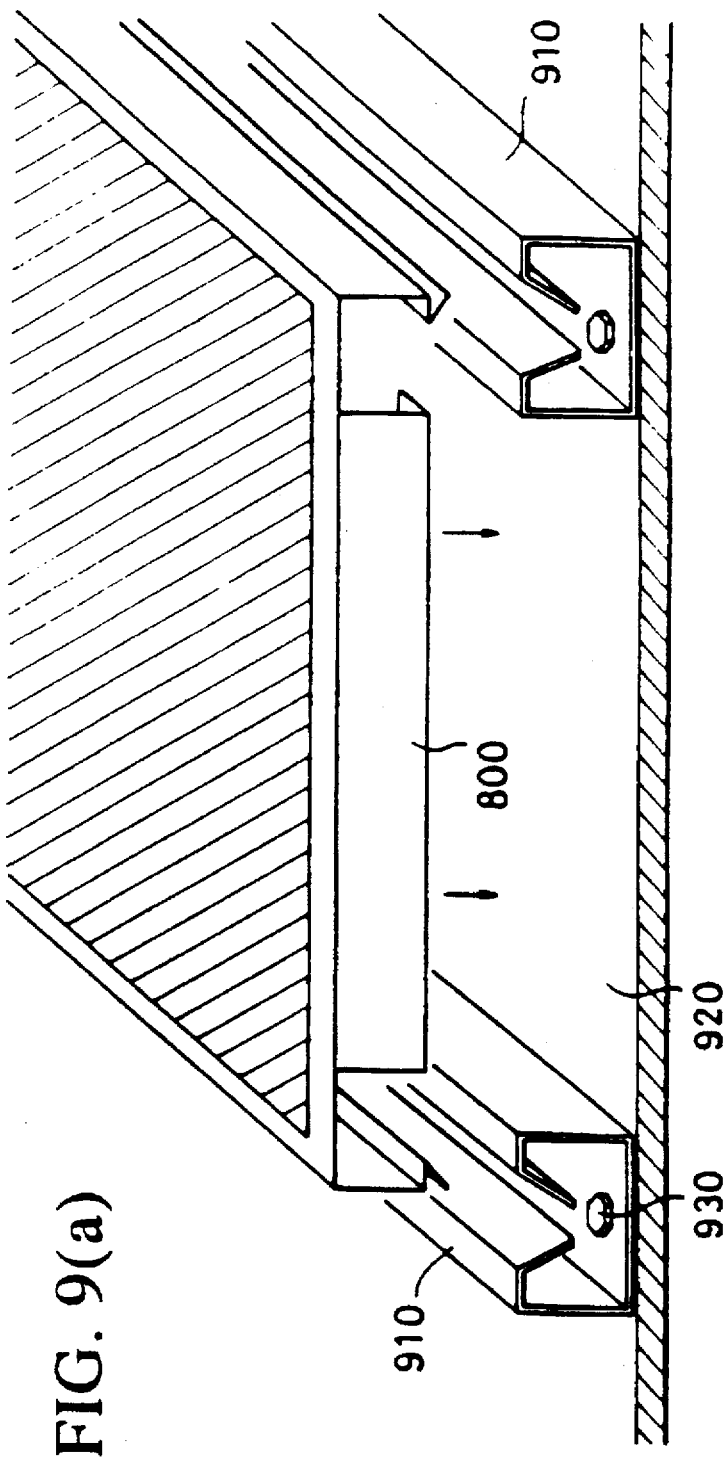
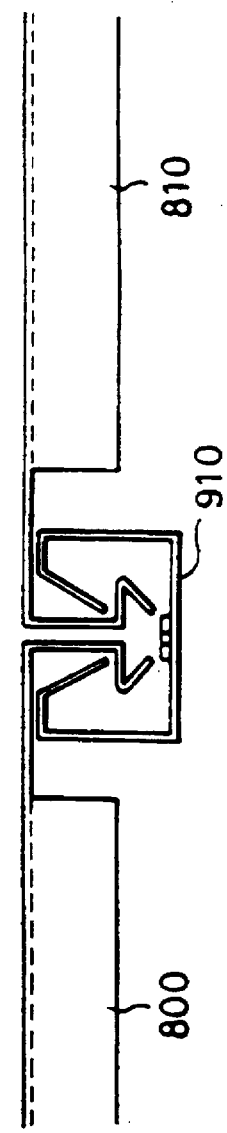
FIG. 9(a)
FIG. 9(b)

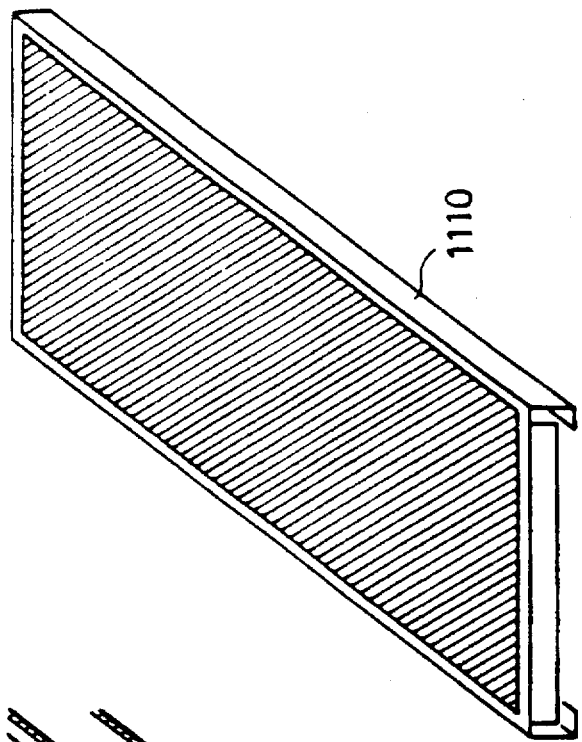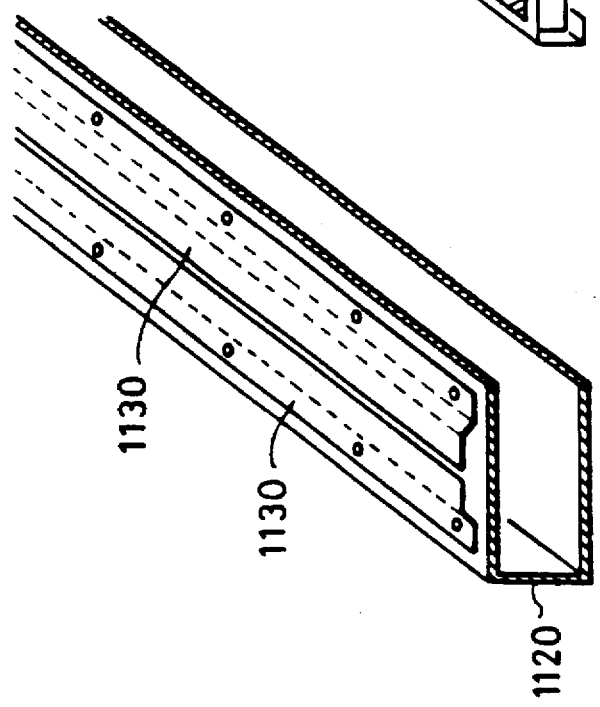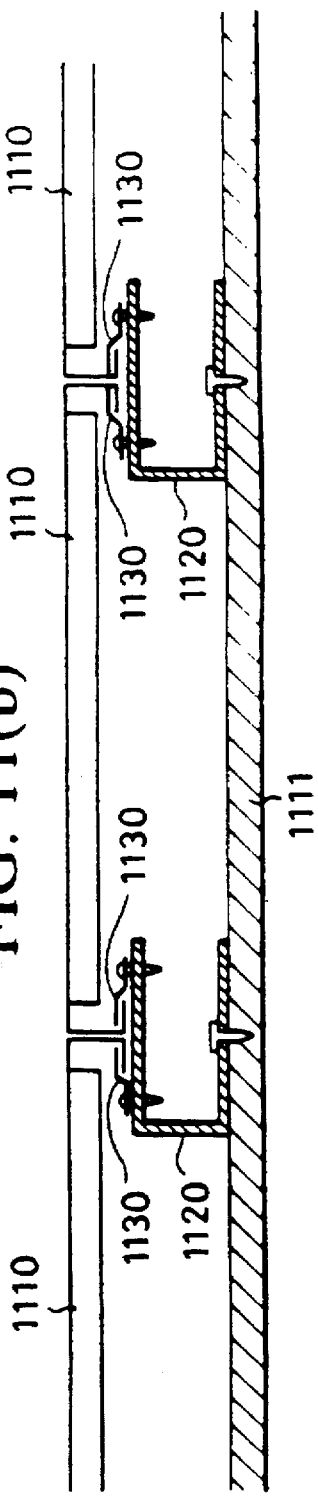

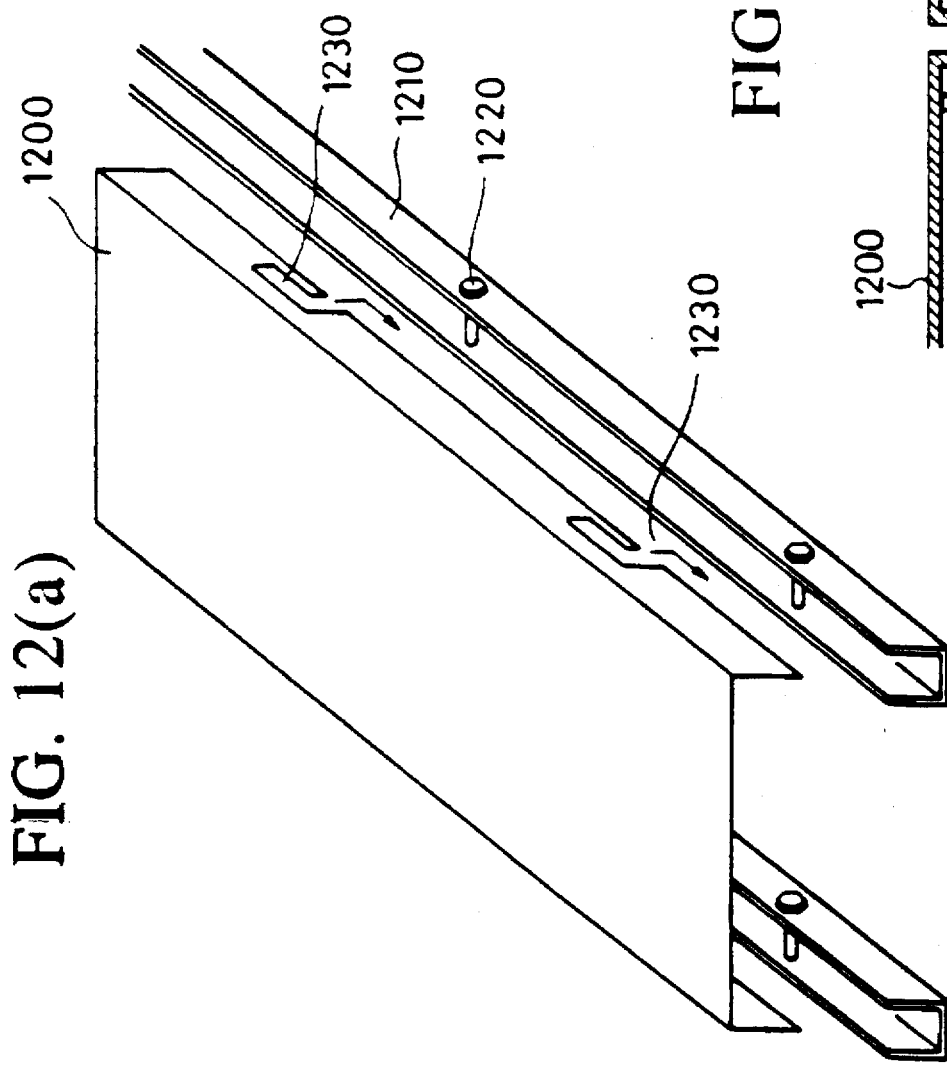
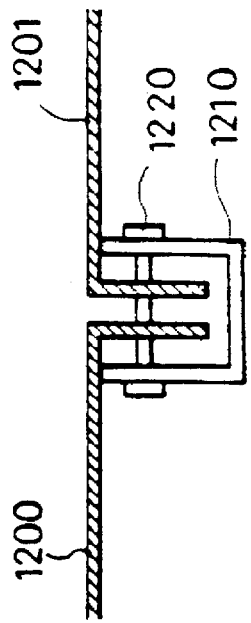
FIG. 12(a)
FIG. 12(b)

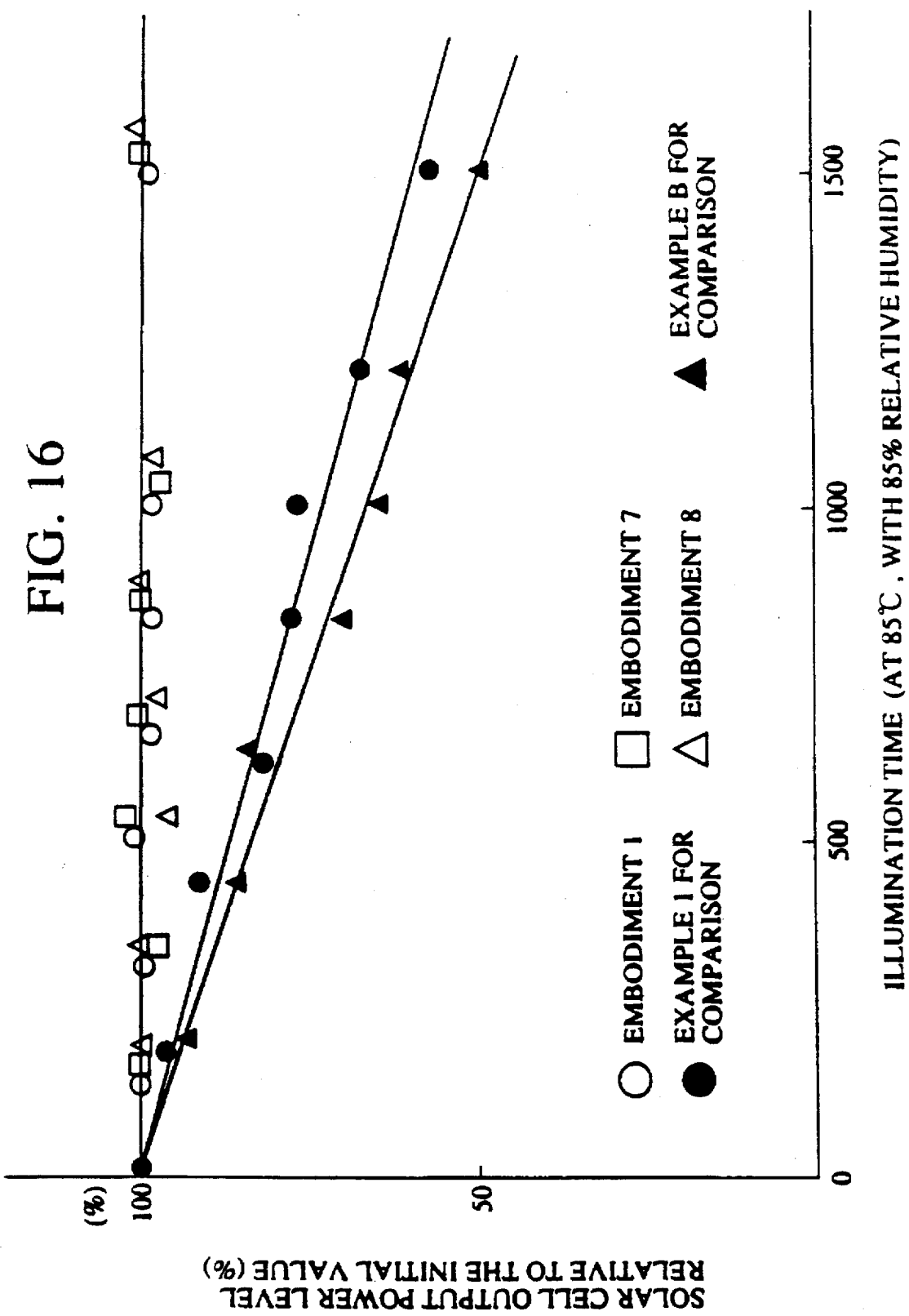

SOLAR CELL MODULE AND INSTALLATION METHOD THEREOF

This application is a division of application Ser. No. 08/520,560, filed Aug. 28, 1995, now U.S. Pat. No. 5,583,057 which is a division of application Ser. No. 08/240,891 filed May 11, 1994, now U.S. Pat. No. 5,480,494.

BACKGROUND OF THE INVENTION

1. Field of the Invention

The present invention relates to a solar cell module with no installation frame, and to an installation method thereof. More specifically, the present invention relates to a solar cell module which has a solar cell reinforcing member, wherein the reinforcing member is also used to install the solar cell module, and which can maintain excellent characteristics without a significant reduction in conversion efficiency. The present invention also relates to a method of installing a solar cell module of this type.

2. Description of the Related Art

In recent years, it has been predicted that an increase in $CO_2$ in the atmosphere will give rise to a green house effect, which will result in a serious global temperature increase. From this view point, the requirement for development of a clean energy source which does not produce $CO_2$ has become serious.

Nuclear power generation does not exhaust $CO_2$. However, it has an unsolved problem regarding the treatment of radioactive waste, and thus it is required to develop a safer and cleaner source.

Among various candidates for clean energy sources for future use, one of the most promising energy sources is a solar cell, which has advantageous properties in that it is clean, safe, and easy to handle.

There are various types of solar cells. One example is a solar cell module comprising an active solar cell element made up of a single crystal silicon. The active solar cell element used in this type of module is sensitive to mechanical shock. Therefore, it is necessary to protect its surface with a thick glass plate and EVA (ethylene-vinyl acetate copolymer), wherein the EVA fills the space between the active solar cell element and the glass plate.

Another example is a solar cell module comprising an active solar cell element made of non-single crystal silicon formed on a glass plate. This type of module also includes a thick glass plate as in the case of solar cell modules made of single crystal silicon.

In solar cell modules of these types having a glass plate on their surface, it is required to attach a frame to them so as to protect the periphery of the glass plate, to reinforce the mechanical strength of the glass plate, and to connect one module to another module or to install the module on an installation base element.

Materials for the frame include metal, plastic, wood, etc. The weight of a solar cell module having a glass plate is as great as 10 KG/m$^2$. Therefore, the frame material should have a sufficiently great mechanical strength to support such a great weight. From this view point, extruded hollow aluminum is commonly used.

However, solar cell modules having an installation frame made of aluminum are expensive. Besides, it is not easy to install such a heavy module on a roof or even on the ground. A strong and heavy installation base frame to install the solar cell module is also required, and the solar cell module must be fixed to the base frame with fastening tools including bolts. Thus, the sum of a material cost, installation cost, and base frame cost becomes great.

Among active solar cell elements made of non-single crystal silicon, amorphous silicon solar cell elements have an excellent property in that they have resistance to bending and mechanical shock,, and thus they can be formed on a flexible substrate such as high molecular weight plastic or a metal substrate such as a stainless steel foil.

Because the active solar cell element formed on a substrate of this kind is flexible and has strong resistance to mechanical shock, there is no need to use glass as a surface protection material. Instead, a weatherable plastic film such as a fluorine resin film is commonly used for the protection.

However, in practice, a flexible amorphous silicon solar cell is installed on a roof or on the ground, in such a manner that a reinforcing member made of e.g. steel is attached to the back face of the solar cell so as to improve the mechanical strength of the solar cell module to make the installation easy, and then the solar cell module is installed on a strong but heavy base by holding the edge faces of the solar cell module with an aluminum frame or the like.

As a result, which the surface of the amorphous solar cell module is protected with a weatherable plastic film, there is a problem similar to that in the crystalline solar cell module.

As can be seen from the above description, there is a strong demand for developing a solar cell module which has a structural strength sufficient to be easily installed without either an aluminum frame or a heavy base. If a solar cell is produced in an integral form with a metal sheet such as that used for a metal roof, then it will become possible to bend the metal sheet, the filler, and the surface protection film at a portion outside the active area, thereby increasing the structural strength of the solar cell module itself, whereby a frameless solar cell module can be realized.

SUMMARY OF THE INVENTION

It is an object of the present invention to provide a solar cell module which has a structural strength sufficient to be easily installed without a heavy frame, and which exhibits excellent long-term reliability without a reduction in the conversion efficiency of the module.

According to one aspect of the present invention to solve the above-described problems and to achieve the above-described object, a solar cell module comprises an active solar cell element, a back face reinforcing member, a filler, a filler holding element, and a weatherable and transparent film wherein the elements other than the back face reinforcing member are disposed on the back face reinforcing member, the solar cell module being characterized in that the back face reinforcing member, the filler, and the weatherable and transparent film are bent at a portion outside the active area in the direction opposite to the surface which is illuminated with the sunlight, wherein there is no filler holding element in the bent portion. Preferably, the active solar cell element is made of amorphous silicon semiconductor formed on a stainless steel substrate. The transparent film is preferably a fluorine resin film. Preferably, the allowable maximum extension ratio of the transparent film is greater than 250%. The back face reinforcing member is preferably made of a metal sheet having good workability.

According to another aspect of the present invention, a solar cell module comprises an active solar cell element, a back face reinforcing member, a filler, a filler holding element, and a transparent film having irregularities, wherein the elements other than the back face reinforcing member are disposed on the back face reinforcing member, the solar cell module being characterized in that the back face reinforcing member, the filler, and the transparent film are bent at a portion outside the active area in the direction opposite to the surface which is illuminated with the sunlight, wherein there is no filler holding element in the bent portion. Preferably, the active solar cell element in this solar cell module is made of amorphous silicon semiconductor formed on a stainless steel substrate.

In the present invention, a solar cell module comprises an active solar cell element, a back face reinforcing member, a filler, a filler holding element, and a weatherable and transparent film, wherein the elements other than the back face reinforcing member are disposed on the back face reinforcing member, and wherein the back face reinforcing member, the filler, and the weatherable and transparent film are bent at a portion outside the active area in the direction opposite to the surface which is illuminated with the sunlight, wherein there is no filler holding element in the bent portion, thereby increasing the structural strength of the solar cell module. As a result, the bent portion can play the role similar to that of a frame. Thus, there is no need to use an additional frame such as an aluminum frame which is required in conventional solar cell modules. As a result, it is possible to reduce the material cost for the frame of the solar cell module, and it is also possible to replace the heavy base frame, which is required to support the aluminum frame, with a light and simple base element.

The inventor of the present invention has found that because the solar cell module of the present invention does not have a filler holding element in the bent portion, breakage in the filler holding element and cracking in the filler due to the breakage of the filler holding element do not occur. The inventor of the present invention has also found that if the filler, the filler, holding element, and the weatherable and transparent film are bent at a portion outside the active area of the solar cell module, then the thickness of the bent portion decreases. As a result, if this solar cell module has been exposed to the outside for a long time, moisture intrudes into the solar cell module via the surface of the weatherable and transparent film and via the filler, and often reaches the filler holding element. The moisture which has reached the filler holding element can further reach the active areas of the solar cell module by the capillary effect, which degrades the characteristics of the solar cell module. In the present invention, however, because there is no filler holding element in the bent portion, the above-described phenomena do not occur. Therefore, the solar cell module according to the present invention can provide excellent long-term reliability.

If the active solar cell element is made of amorphous silicon semiconductor formed on a flexible stainless steel substrate, then the following advantages can be obtained. An amorphous silicon semiconductor as thin as 0.1 mm can be formed on a stainless steel substrate, thereby reducing the amounts of the filler and the filler holding element. As a result, it is possible to reduce the thickness of the solar cell module. In contrast, if the thickness of the solar cell module becomes great, then the amount of extension of the weatherable film lying on the surface of the solar cell module becomes undesirably great when the solar cell module is bent in the direction opposite to the surface which is illuminated with sunlight, whereby the weatherable film is easily broken. Furthermore, if a flexible active solar cell element is used, then the solar cell module itself does not need to have very large rigidity. Therefore, a thin sheet can be used as the back face reinforcing member, and it is possible to prevent the weatherable film from cracking as described above. Moreover, if an amorphous silicon semiconductor formed on a stainless steel substrate is used, then the weight of the active solar cell element can be reduced, whereby the mechanical strength required for the back face reinforcing member can be reduced. As a result, a thinner sheet can be used as the back face reinforcing member, thereby preventing the weatherable film from being broken for the same reason as that described above.

Furthermore, if a fluorine resin film is used as the weatherable and transparent film, then the solar cell module will be excellent in high temperature resistance, weatherability, and chemical resistance. The fluorine resin film is also excellent in stainproofing, and the surface of the solar cell module is prevented from easily becoming dirty with dust or particles. Therefore, the solar cell module can maintain high performance for a long term.

If a weatherable film having the allowable maximum extension ratio greater than 250% is used, when a portion outside the active area of the solar cell module is bent in the direction opposite to the surface illuminated with the sunlight, cracking in the weatherable film in the bending portion can be prevented, and the stress occurring due to the bending and the local reduction in thickness of the filler can also be reduced.

Furthermore, if the weatherable and transparent film of the solar cell module has irregularities, then the contact area between the filler and the weatherable and transparent film increases, whereby the adhesion strength between the filler and the weatherable and transparent film increases, which results in improvement in the long-term reliability. However, if the weatherable and transparent film of the solar cell module has irregularities, and if there is a filler holding element in the bent portion, when the bent portion is bent in the direction opposite to the surface illuminated with the sunlight, the filler in the bent portion becomes partially thinner. Therefore, if this type of solar cell has been exposed to the outside for a long time, the moisture intrudes into the solar cell via the weatherable and transparent film and via the filler, and often reaches the filler holding element. As a result, degradation occurs in the characteristics of the solar cell module. In the solar cell module according to the present invention, there is no filler holding element in the bent portion, and thus the above-described phenomenon does not occur even in the case where the weatherable and transparent film has irregularities. As a result, this type of solar cell module according to the present invention exhibits excellent long-term reliability.

BRIEF DESCRIPTION OF THE DRAWINGS

FIG. 6(a) is a plan view of a solar cell module having a laminated structure for use in the present invention; FIGS. 6(b) and 6(c) are cross-sectional views thereof;

FIG. 9 is a schematic representation of a method of installing a solar cell module according to one embodiment of the present invention;

FIG. 11(a) is a perspective view of a mounting base element for installing a solar cell module according to the present invention; FIG. 11(b) is a cross-sectional view thereof; FIG. 11(c) is a schematic diagram illustrating another embodiment of a solar cell module according to the present invention;

FIG. 12(a) is a schematic diagram illustrating a method of installing a solar cell module according to another embodiment of the present invention; FIG. 12(b) is a cross-sectional view illustrating an installing portion of the solar cell module according to the above embodiment;

FIGS. 16 is a graph illustrating output levels relative to initial values of solar cell modules of example 1 according to the present invention and of comparison example 1;

DESCRIPTION OF THE PREFERRED EMBODIMENTS

Figure 14A:
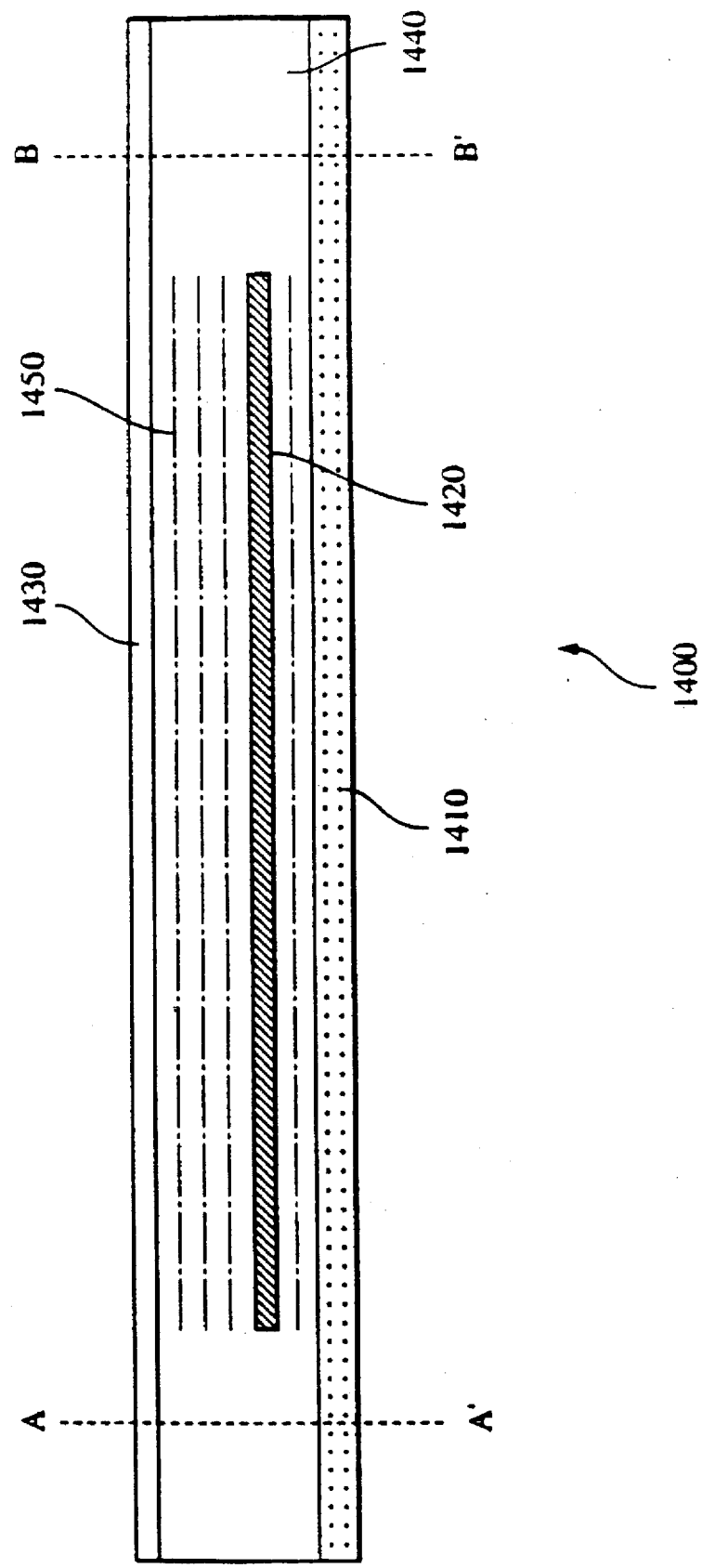
FIG. 14 is a schematic diagram illustrating a solar cell module having a laminated structure for use in an example of the present invention.
Figure 14B:
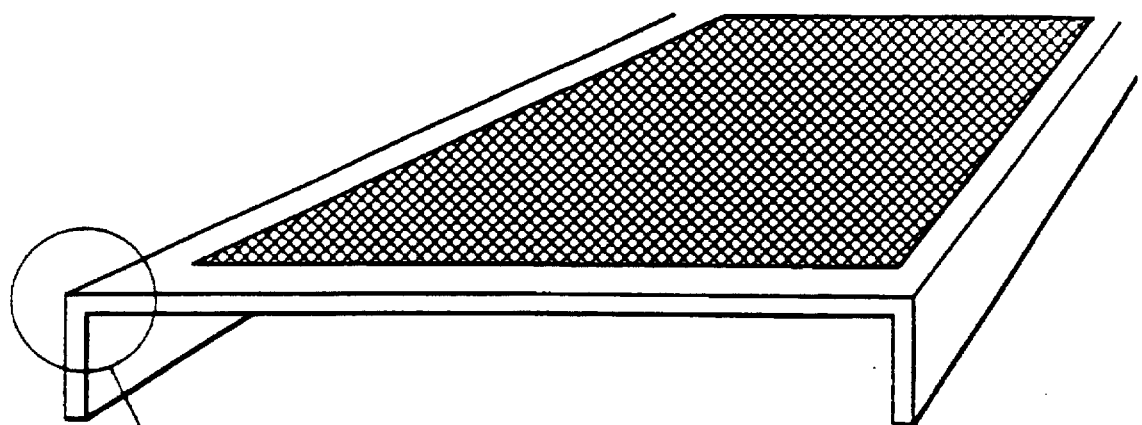
Figure 14C:
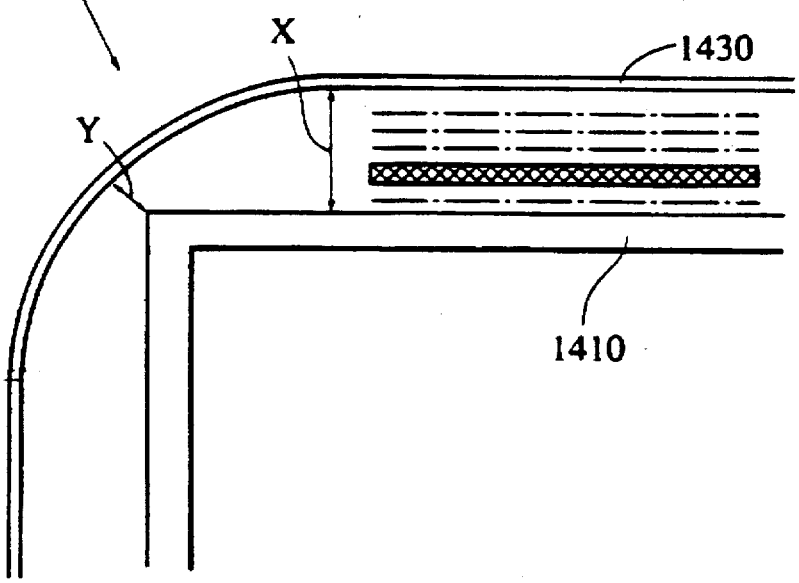

Referring to FIGS. 14(a)–14(c), preferred embodiments of the present invention will be described in detail below. FIG. 14(a) is a cross-sectional view of a solar cell module comprising an active solar cell element 1420, a filler 1440, a filler holding element 1450, and a weatherable and transparent film 1430, wherein all those elements are disposed on a back face reinforcing member 1410. The back face reinforcing member, the filler, and the weatherable and transparent film can be bent at the planes denoted by the broken lines A–A' and B–B' outside the active area of the solar cell.

FIG. 14(b) is an enlarged perspective view of a bent portion at which the solar cell module is bent in the direction opposite to the surface which is illuminated with the sunlight. As shown in FIGS. 14(a) and 14(b), there is no filler holding element in the bent portion at which the solar cell module is bent in the direction opposite to the surface which is illuminated with the sunlight.

The solar cell of the present embodiment may be produced for example according to the following steps. First, a back face reinforcing member is prepared, and then a filler material such as EVA in a sheet form is placed on the back face reinforcing member such that the filler material covers the entire surface area of the back face reinforcing member. Furthermore, a filler holding element made of non-woven glass cloth in a sheet form is placed on the filler material, wherein the filler holding element has a size large enough to cover at least the active solar cell element, and small enough to cover at least the active solar cell element, and small enough not to cover the bent portion. Furthermore, an active solar cell element, a filler in a sheet form, a filler holding element having a size large enough to cover at least the active solar cell element, and small enough not to cover the bending portion, and a weatherable film are successively placed one on another. Then, they are pressed and degassed at a high temperature, thereby melting the filler. Thus, the active solar cell element is sandwiched between the back face reinforcing member and the weatherable and transparent film.

In the above process, if irregularities are formed on the surface of the solar cell module, for example by pressing a wire mesh to the weatherable and transparent film, then the adhesion between the filler and the weatherable and transparent film may be improved, thereby improving the reliability of the solar cell module.

Then the solar cell module is bent with a bending machine at the portion outside the active area of the solar cell, wherein the bent portion does not overlap the filler holding element such as a non-woven cloth, and wherein the bending is performed in the direction opposite to the surface which is illuminated with the sunlight.

Transparent Film

There is no special limitation in the transparent film for use in the present invention, except that the allowable maximum extension ratio of the transparent film in the extension direction due to the bending is preferably greater than 250%.

If the allowable maximum extension ratio of the transparent film is less than 250%, cracking often occurs in the transparent film in the bending portion when the solar cell module is bent.

Even if the degree of cracking in the transparent film is very slight, the cracks can expand during the outdoor operation, and eventually the cracks will induce the separation of the transparent film. The moisture may easily intrude into the filler through the cracks, which will cause the degradation in the characteristics of the solar cell.

Any type of transparent film may be used: however a fluorine resin film is preferable, and more specifically, non-stretched type ethylene-tetrafluoroethylene copolymer film is more preferable in weatherability, mechanical strength, high temperature resistance, chemical resistance, stainproof, and transparency.

Filler

As for a filler for use in the present invention, ethylene-vinyl acetone copolymer (EVA), polyvinyl butyral, and a silicone resin may be used. However, the filler is not limited only to those.

Filler Holding Element

In the present invention, the filler holding element is used to prevent the filler from flowing out when the filler becomes hot. The filler holding element also serves as a protector for protecting the solar cell when the surface of the solar cell module is scratched with a sharp edge.

When the solar cell module is subjected to the high temperature vacuum degassing process, the filler holding element induces the removal of residual air present in the solar cell module to the outside of the solar cell module. It is required that there be no filler holding element in the portion at which the solar cell module is bent in the direction opposite to the surface which is illuminated with sunlight.

The filler holding element should cover at least the active area of the solar cell so that the filler holding element may protect the solar cell when the surface of the solar cell module is scratched with a sharp edge, however, it can be present anywhere except the bent portions.

It is preferable that the area of the filler holding element is as large as possible, as long as there is no filler holding element in the bent portion. For example, it is preferable that the filler holding element covers the entire active area of the solar cell and further extends to the portion just near the bent portion. More preferably, the area outside the bent portion also has the filler holding element. To ensure that the residual air can escape from the inside to the outside of the solar cell through the filler holding element when the solar cell is heated and degassed in vacuum, it is preferable that the filler holding element covers as large an area of the solar cell as possible.

Whereas there is no special limitation in the type of the filler holding element for use in the present invention, it is preferable that the filler holding element has a high vacancy ratio, a high transparency, and a high mechanical strength. From this view point, for example a non-woven glass cloth or a non-woven polymer cloth is preferable.

Reinforcing Member

As for the reinforcing member which forms the structure of the solar cell module of the present invention, there is no special limitation except that it should be flexible. For example, a stainless steel, a plated steel, and a galvanized steel may be used. To obtain a strong enough structural strength after the solar cell module is bent, the thickness of the reinforcing member is preferably in the range from 0.2 mm to 2.0 mm, and more preferably in the range from 0.3 mm to 1.6 mm.

Active Solar Cell Element

There is no special limitation on the type of active solar cell element for use in the present invention: however a flexible active solar cell element is preferable. An active solar cell element with amorphous silicon semiconductor formed on a stainless steel may be used more preferably.

If a flexible active solar cell element is used, then the solar cell module itself does not need to be very rigid. Therefore, a thin sheet can be used as the back face reinforcing member. The use of this sheet can prevent the weatherable film from cracking, as described above.

With amorphous silicon semiconductors, a very thin film such as 0.1 mm can be formed on a stainless steel substrate. Therefore, the active solar cell element can be encapsulated with a small amount of filler, thereby reducing the thickness of the solar cell module. In contrast, if the thickness of the solar cell module becomes great, then the amount of extension of the weatherable film lying on the surface of the solar cell module becomes undesirably great when the solar cell module is bent in the direction opposite to the surface which is illuminated with sunlight, whereby the weatherable film will be easily broken.

Moreover, if amorphous silicon semiconductor formed on a stainless steel substrate is used, then the weight of the active solar cell element can be reduced, whereby the mechanical strength required for the back face reinforcing member can be reduced. As a result, a thinner sheet can be used as the back face reinforcing member, thereby preventing the weatherable film from being broken for the same reason as that described above.

Figure 1:
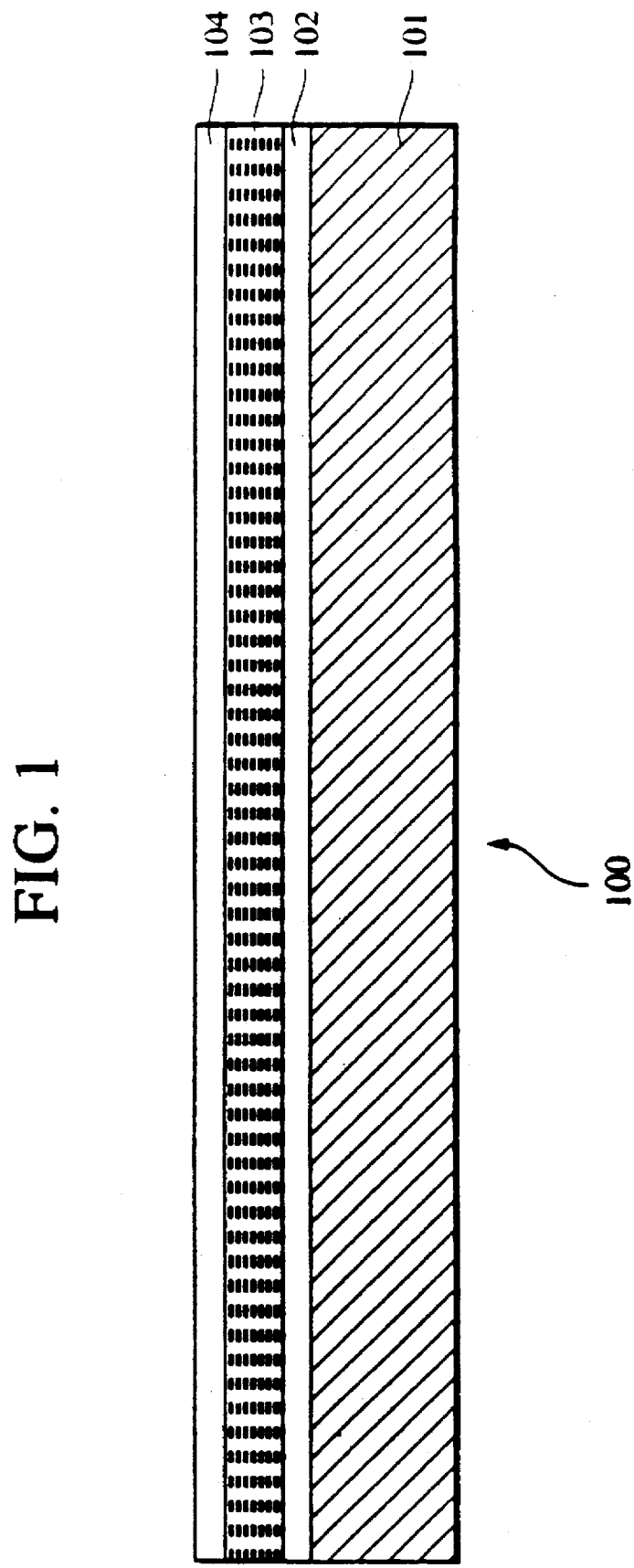
FIG. 1 is a cross-section view of a semiconductor device for use in an embodiment of a solar cell according to the present invention.

FIG. 1 is a cross-sectional view of an example of an active solar cell element for use in the solar cell module of the present invention. As shown in this figure, the active solar cell element comprises a conductive substrate 101, a back face reflection layer 102, a semiconductor layer 103 serving as a photoelectric conversion element, and a transparent conductive layer 104. Instead of providing a separate back face reflection layer 102, the conductive substrate 101 may also serve as the back face reflection layer.

As for the conductive substrate 101, various types of materials may be used. These include stainless steel, aluminum, copper, titanium, a carbon sheet, a steel plated with tin, a plastic film such as polyamide, polyester, polyethylene naphthalide, epoxy wherein the plastic film has a conductive layer, and ceramic having conductive layer.

As for the semiconductor layer 103, amorphous silicon based semiconductors, polysilicon semiconductors, crystalline silicon semiconductors, or compound semiconductors such as copper indium selenide may be preferably used. The amorphous silicon semiconductor may be formed from silane gas or the like by means of plasma CVD technique. The polysilicon semiconductor may be obtained by forming molten silicon into a sheet shape, or otherwise, by performing heat treatment on the amorphous silicon based semiconductor.

$CuInSe_2/CdS$ can be formed by electron beam evaporation, sputtering, electrocrystallization, etc. As for the structure of the semiconductor layer, a pin junction, pn junction, or Schottky type junction may be employed. The semiconductor layer should be disposed between the back face electrode layer 102 and the transparent conductive layer 104. As for the back face electrode layer 102, a metal layer, metal oxide layer, or a combination of these may be used.

As a material for the metal layer, Ti, Al, Ag, or Ni may be used, and ZnO, $TiO_2$, $SnO_2$ may be employed as a material for the metal oxide layer. The metal layer and the metal oxide layer may be formed by resistance heating evaporation, electron beam evaporation, sputtering, spraying, CVD, impurity diffusion, etc. To efficiently collect the photovoltaic current, a grid-shaped current collecting electrode may be formed on the transparent conductive layer, using Ti, Cr, Mo, W, Al, Ag, Ni, Cu, Sn, or conductive paste such as silver paste. The grid-shaped electrode may be formed by various techniques. These include an evaporation technique such as sputtering, resistance heating evaporation, or CVD, in conjunction with a mask pattern; a technique of evaporating a metal layer on the entire surface area, then patterning the metal layer by etching; a technique of directly forming a grid electrode pattern by photo-assisted CVD; a technique of forming a mask having a negative pattern of the grid-shaped electrode, then forming the electrode pattern by plating; and a technique of printing a grid-shaped electrode with conductive paste. As for the conductive paste, a mixture of binder polymer and powder of gold, silver, copper, nickel, carbon, etc. may be used. As for the binder, various types of resins such as polyester, epoxy, acrylic, alkyd, polyvinyl acetate, rubber, urethane, and phenol may be used.

The current collected by the grid-shaped electrode may be further collected and transmitted by a bus bar which may be made of tin, solder coated copper, or nickel. The bus bar may be connected to the grid-shaped electrode with a conductive adhesive or by soldering.

Bending of the Solar Cell Module

FIG. 15 illustrates some examples of techniques of installing a solar cell module on a fixing base element of a receiving base element, wherein the filler, the weatherable film, and the back face reinforcing member outside the active area of the solar cell module are bent toward the side opposite the surface which is illuminated with sunlight. In FIG. 15, reference numeral 1501 denotes an active solar cell element, 1580 denotes filler holding element, 1520 denotes filler, 1530 denotes a back face reinforcing member, 1510 denotes a weatherable and transparent film, 1540 denotes a fastener for fixing a solar cell module on a fixing base element 1550, and 1560 denotes a receiving base element for accepting a bent solar cell module. The filler holding element is disposed between the active solar cell element and the weatherable film, or between the active solar cell element and the back face reinforcing member.

Figure 15A:
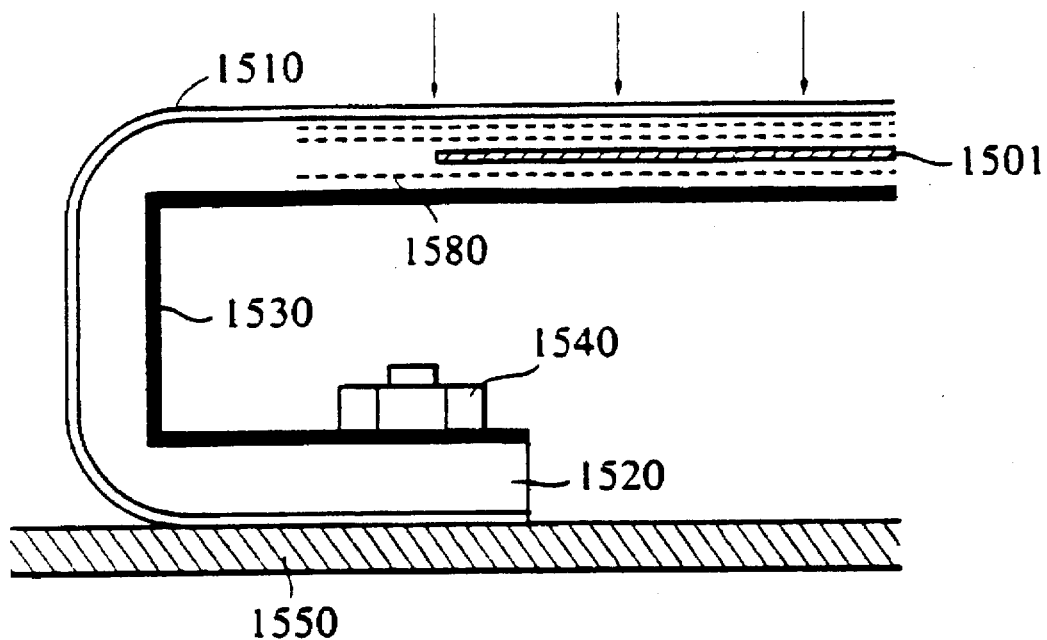
FIGS. 15(a)–15(d) are cross-sectional views illustrating installation portions of examples of solar cell modules according to the present invention.

FIG. 15(a) illustrates an installation example in which the area of the filler holding element is greater than that of the active solar cell element, and the solar cell module is bent inward twice at the portion where there is no filler holding element, and then the solar cell module is placed on a fixing base element, and fixed to it with a fastener.

Figure 15B:
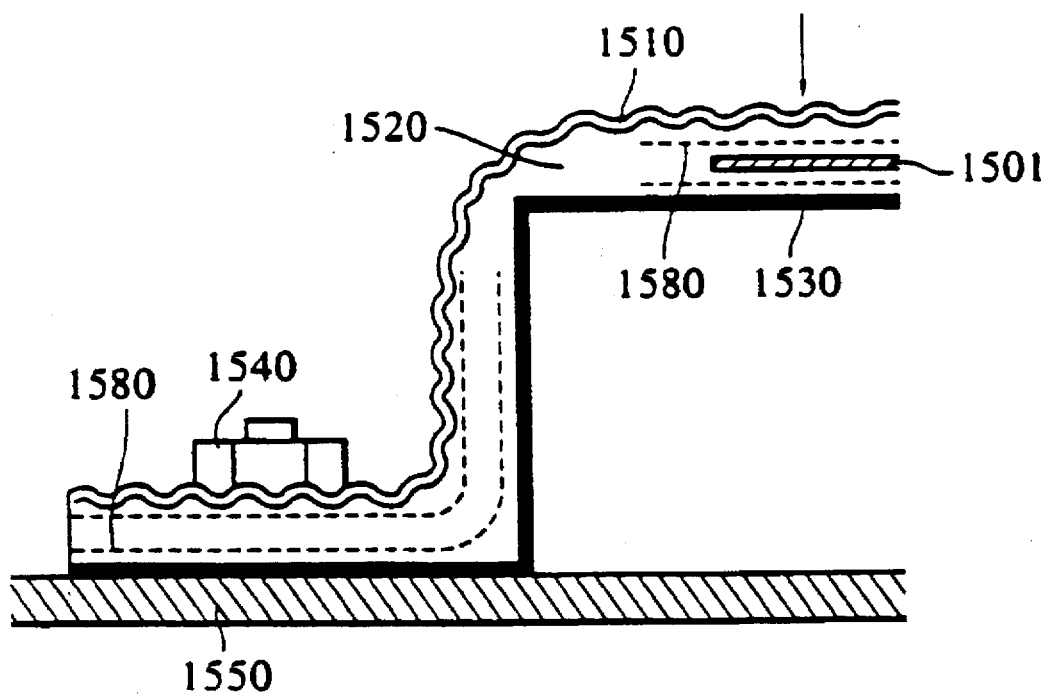

FIG. 15(b) illustrates an installation example in which the solar cell module is bent at a place outside the active solar cell element in the direction opposite to the surface which is illumination with the sunlight, and the solar cell module is further bent at a right angle at a place more outward than the first bending place in the direction opposite to that in the first bending, and then the solar cell module is fixed to the fixing base element with a fastener as in the technique shown in FIG. 15(a). In this example, the area of the filler holding element is greater than that of the active solar cell element, and furthermore, additional filler holding element is disposed outside the bending portion. The weatherable and transparent film 1510 is subjected to an embossing process so as to form irregularities on its surface.

Figure 15C:
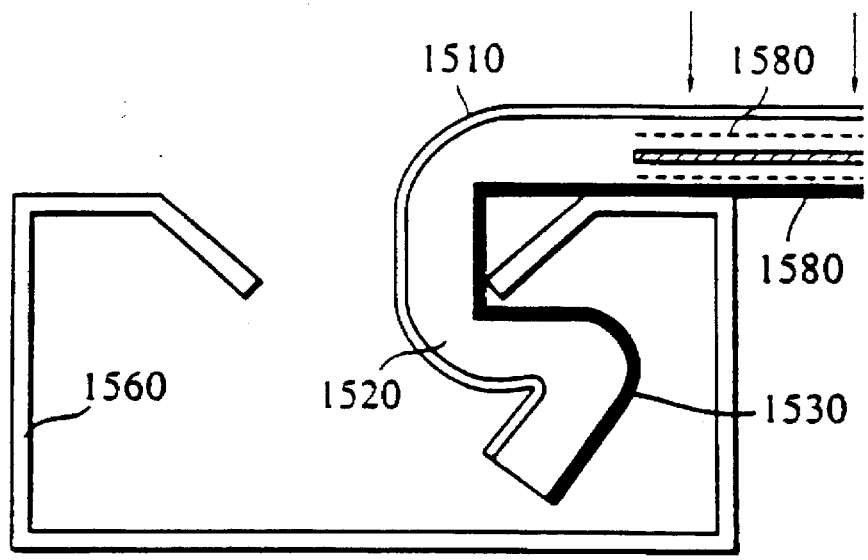

FIG. 15(c) illustrates another installation example in which the solar cell module shown in FIG. 15(a) is further bent outward, and fitted into a receiving base element, thereby fixing the solar cell module. In this example, the area of the filler holding element is the same as that of the active solar cell element. In this installation technique, the solar cell module can be easily installed by fixing it without using any fastener.

Figure 15D:
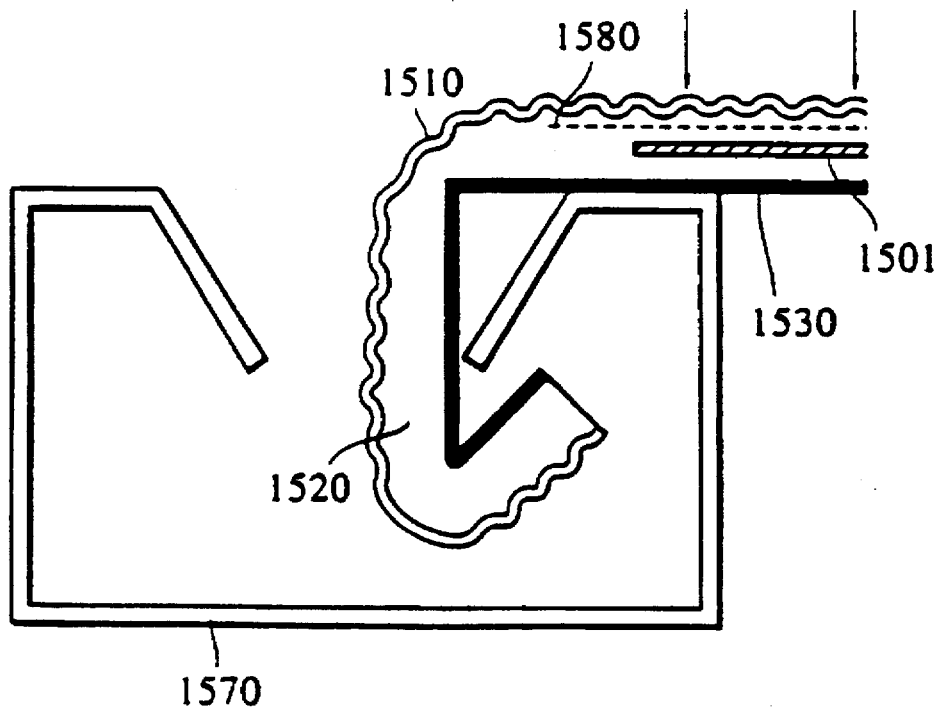

FIG. 15(d) illustrates another installation example in which the solar cell module is bent in a similar manner to that shown in FIG. 15(c): however, in this case the solar cell module is bent beyond a right angle to form an acute angle at one bent portion. This solar cell module can be fixed by fitting it in a receiving base element without using any fasteners. Therefore, this technique also provides easy installation, as in the technique shown in FIG. 15(c). In this example, only one filler holding element is used, wherein its area is greater than that of the active solar cell element. The weatherable and transparent film has irregularities as that shown in FIG. 15(b).

Method of Bending the Solar Cell Module

There are no special limitations in the method of bending the solar cell module. However, taking into account the fact that the surface of the solar cell module is made of a weatherable film such as fluorine resin film which is sensitive to surface damage, it is preferable to use a bending machine which does not easily damage the surface of the solar cell module during the bending process. For example, bending may be preferably performed according to the following steps: a solar cell module is placed on a soft fixture made of, for example urethane resin, in such a manner that the weatherable film surface is in contact with the soft fixture; an edge is placed on the back face reinforcing member; and then the solar cell module is bent by applying force to the solar cell module via the edge.

Referring to specific examples, the present invention will be described in more detail below. However, nothing herein should be understood to limit this invention to those examples only.

EXAMPLE 1

In this example, there will be described a solar cell module which is produced by connecting in series amorphous silicon solar cell active elements formed on a stainless steel substrate, and then disposing a reinforcing member made of a 0.8 mm thick tin plated steel on the back face. First, the amorphous silicon solar cell active elements (refer to FIG. 1) were produced as follows. A 5000 Å thick Al film 102 containing 1% Si was formed by means of sputtering on a cleaned 0.1 mm thick elongated stainless steel substrate 101.

Then a semiconductor layer 103 comprising an n/i/p-multilayer structure of non-single crystal silicon was formed by means of a plasma CVD technique, wherein the n-type semiconductor layer was formed using $PH_3$, $SiH_4$, and $H_2$ gases, the i-type semiconductor layer was formed using $SiH_4$ and $H_2$ gases, and the p-type semiconductor layer was formed using $B_2H_6$, $SiH_4$, and $H_2$ gases. The thicknesses of these layers were 300 Å for the n-type semiconductor, 4000 Å for the i-type semiconductor, and 100 Å for the p-type semiconductor. After that, 800 Å thick ITO 104 was formed by the resistance heating evaporation technique, whereby an amorphous silicon solar cell active element 100 was completed.

Figure 2:
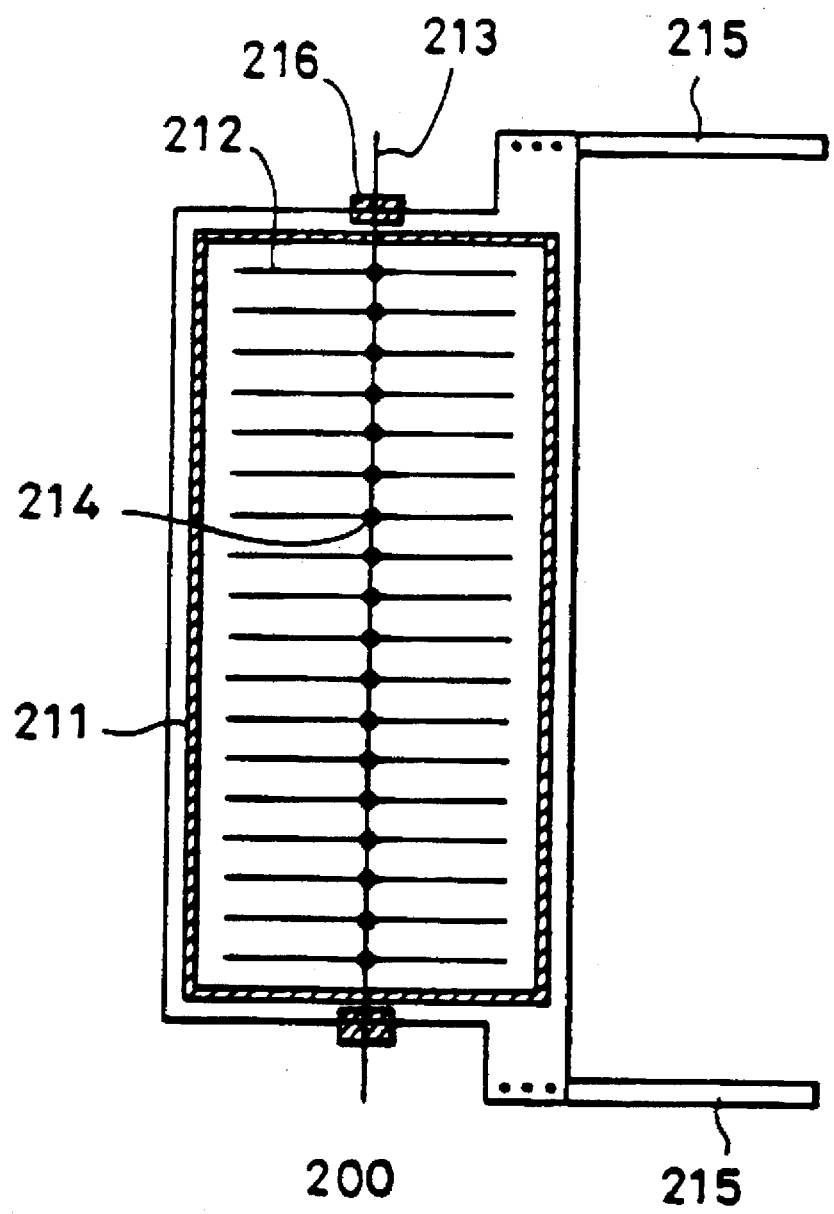
FIG. 2 is a plan view of a solar cell element for use in the embodiment of the solar cell module according to the present invention.

Then, the elongated active solar cell element was cut by a press machine into a plurality of active solar cells each having a size of 30 cm×15 cm as shown in FIG. 2.

Figure 3:
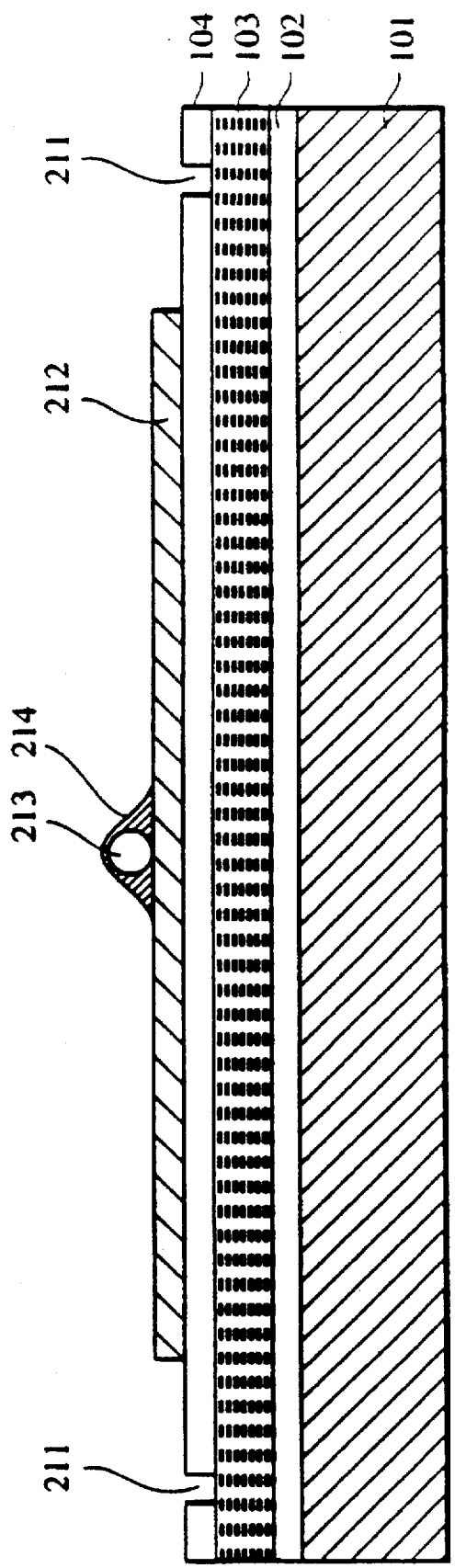
FIG. 3 is a cross-sectional view of the solar cell element for use in the embodiment of the solar cell module according to the present invention.

At this stage, each active solar cell element was broken at the edges cut by the press machine, and short circuited between the ITO electrode and the stainless steel substrate. To repair the short circuiting, the peripheral portion of the ITO electrode of each active solar cell element was removed (211), as shown in FIGS. 2 and 3. In this process for removing the peripheral portion of the ITO electrode, an etchant ($FeCl_3$ solution), which can selectively etch the ITO without etching the amorphous silicon semiconductor, was screen-printed in the peripheral area of the ITO which was slightly inner to the cut edges, so as to dissolve the ITO, and then water rinsing was performed, whereby the isolation area 211 was formed in the ITO electrode.

Then a mixture of silver paste (5007, available from Du Pont Company) and a polyester resin serving as a binder was screen-printed and then heat-cured, whereby a grid-shaped current collecting electrode 212 was formed on the ITO electrode.

A tin-plated wire 213 serving as an electrode for collecting current from the grid-shaped electrode was disposed in such a manner that the tin-plated wire crosses the grid-shaped electrode at a right angle, and then a drop of silver-filled adhesive 214 (C-220, available from Emarson & Cuming, Inc.) was fed onto each intersection, and dried at 150° C. for 30 min., whereby the grid-shaped electrode was connected to the tin-plated copper wire. In this process, a polyimide tape 216 was disposed under the tin-plated copper wire 213 so as to prevent the tin-plated copper wire from coming into contact with the edge faces of the stainless steel substrate.

A part of the ITO layer/a-Si layer outside the active area of the amorphous silicon solar cell element was removed by grinding, thereby exposing the stainless steel substrate, and then a copper foil 215 was welded to the exposed portion by a spot welder.

Figure 4:
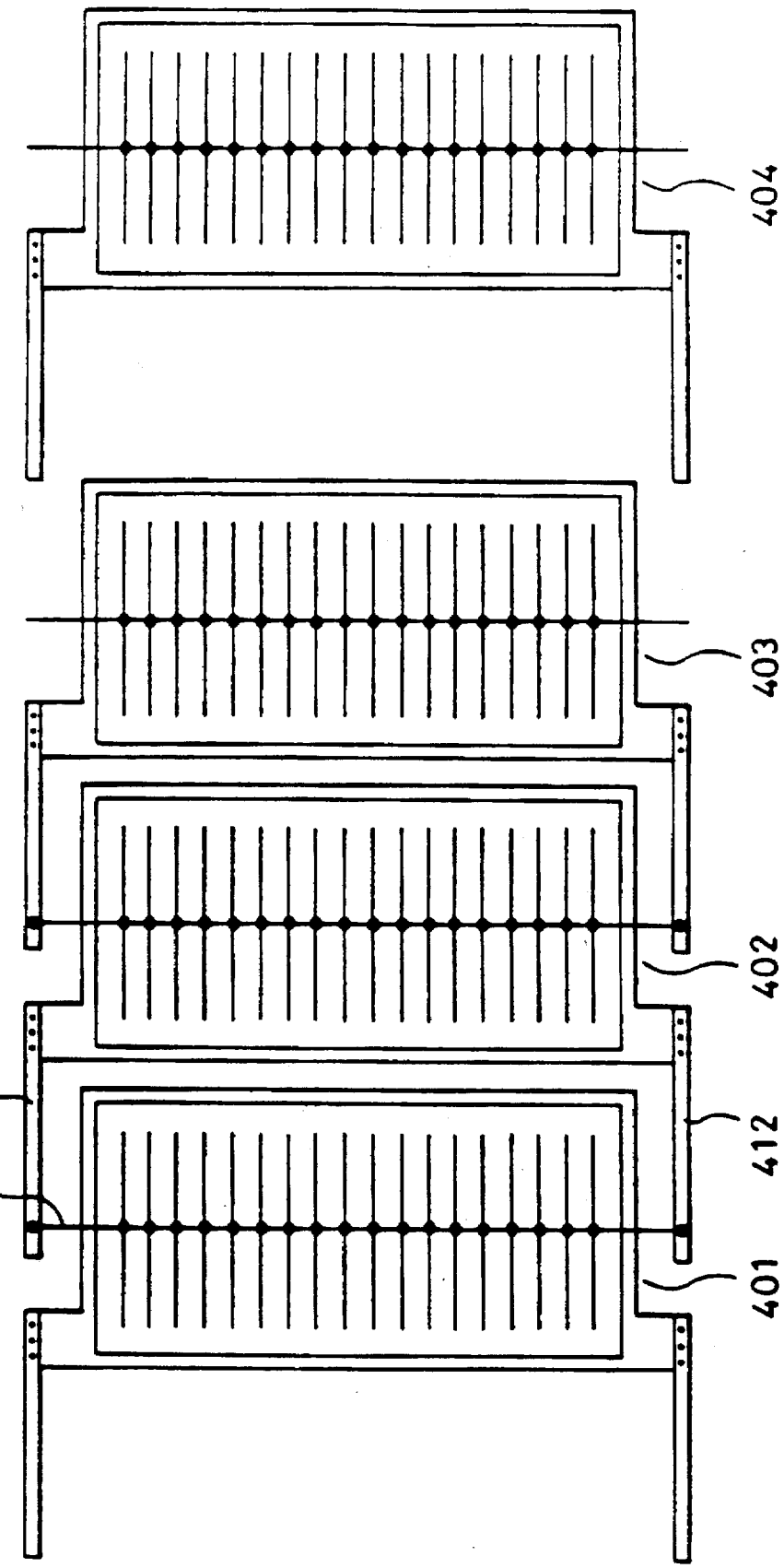
FIG. 4 is a schematic representation of solar cell elements for use in the embodiment of the solar cell module according to the present invention, wherein the solar cell elements are connected in series.

Referring now to FIG. 4, tin-plated copper wire 411 of the solar cell element 401 was connected by soldering in series to the copper foil 412 of the solar cell element 402. Adjacent solar cell elements were connected to each other in a similar manner, whereby 13 solar cell elements were connected in series.

Figure 5:
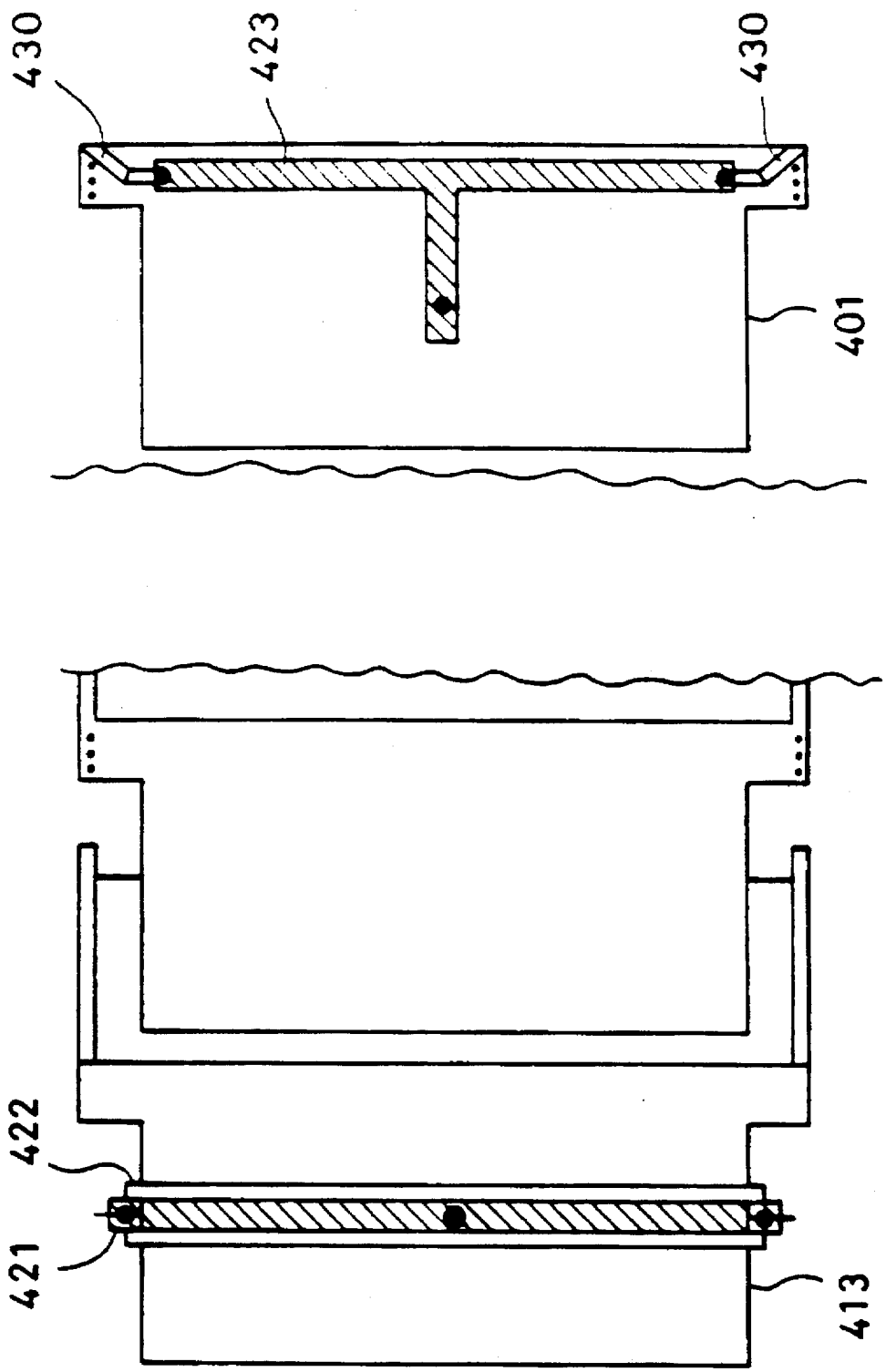
FIG. 5 is a schematic representation of output terminals of the solar cell element for use in the embodiment of the solar cell module according to the present invention.

Wiring to positive and negative terminals was performed across the back surface of the stainless steel substrate. FIG. 5 illustrates the wiring on the back faces of the solar cell elements connected in series. The positive side of the wiring was made by attaching an insulating polyester tape 422 to the central area of the 13th solar cell element 413, further attaching a copper foil 421 to it, and then connecting the copper foil 421 to the tin-plated copper wire with solder. The negative side wiring was made by connecting the first solar cell element 401 to a copper foil 423 as shown in FIG. 5, and further connecting the copper foil 423 to a copper foil 430 which had been connected to the solar cell element 401 by spot welding. Then as seen in FIG. 6, a 0.8 mm thick zinc-plated steel sheet 601, 0.5 mm thick EVA sheet 602, a 0.1 mm thick non-woven glass cloth with 95% vacancies 605, 13 solar cell elements 603 connected in series, EVA 602, a non-woven glass cloth, EVA 602, a non-woven glass cloth, a 50 µm thick non-extended ethylene-tetraethylene copolymer fluorine resin film 604 (Aflex, available from Asahi Glass Company) were placed one on another, and then heated at 150° C. for 100 min. with a vacuum laminator, thereby melting the EVA. Thus a complete solar cell module 600 was obtained, wherein the solar cell module comprises the solar cell elements 603 sandwiched between the zinc-plated steel and the non-extended fluorine resin film, all these elements being encapsulated with the resin. Before the above process was performed, the surface of the non-extended fluorine resin film 604 had been subjected to a plasma treatment so as to enhance the adhesion to the EVA 602. The allowable maximum extension ratio of the non-extended fluorine resin film 604 used here was 250%.

The size of the solar cell elements 603 connected in series was designed to be smaller than that of the zinc-plated steel disposed on the back face, or that of the non-extended fluorine resin film 604 so that the solar cell module could be bent at peripheral portions in a later process step.

The size of the filler holding element was designed to be the same as that of the solar cell element portion so that there was no filler holding element in the bending portion which might obstruct the bending of the solar cell module in the direction opposite to the surface to be illuminated with the sunlight.

Then, the four corners of the solar cell module 600 were cut away by a cutting machine in such a manner that the cutting would not affect the characteristics of the active solar cell element 603. Thus, the solar cell module was complete.

Figure 7:
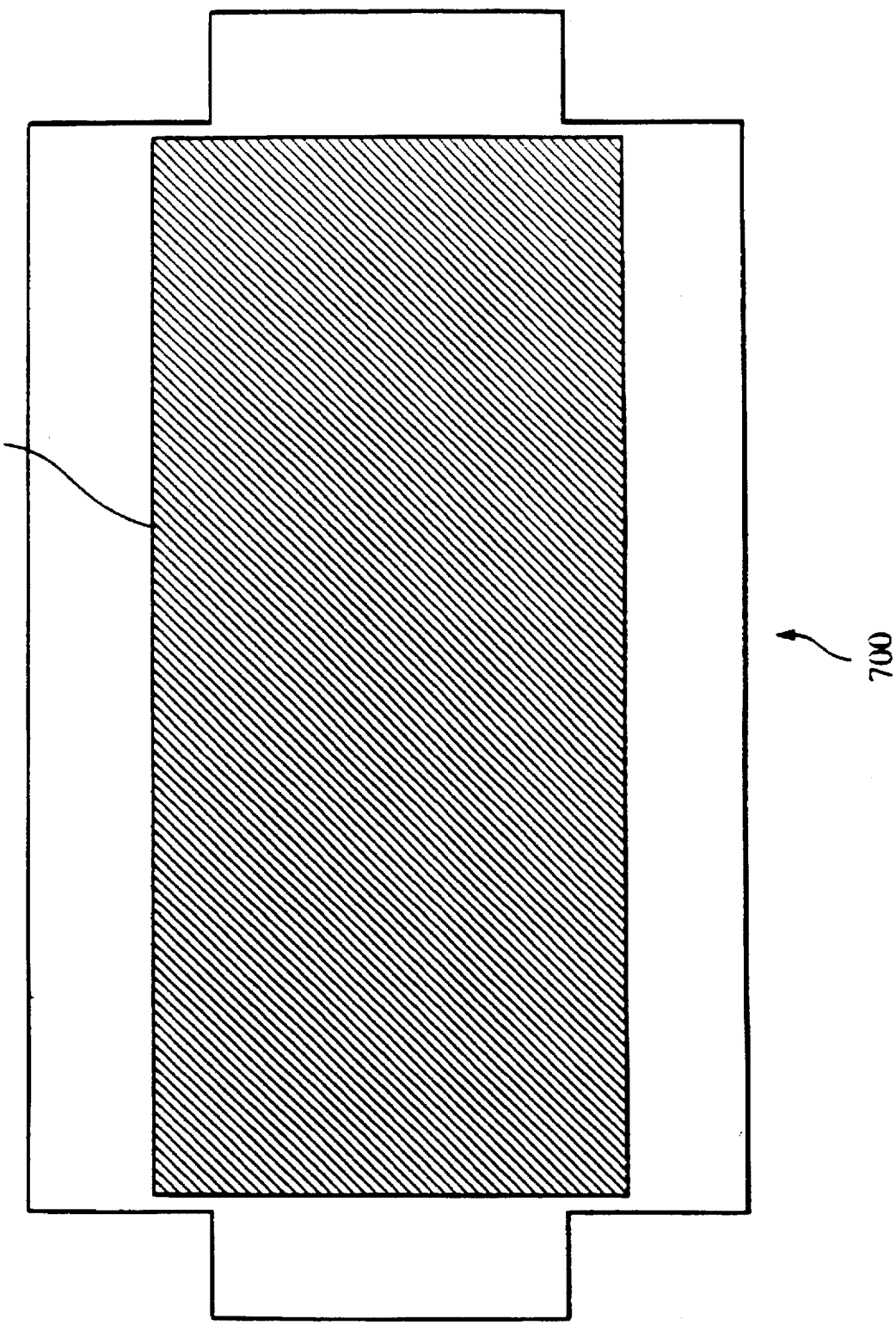
FIG. 7 is a plan view of a solar cell module having a laminated structure for use in the present invention, wherein the solar cell module is partially cut out.
Figure 8:
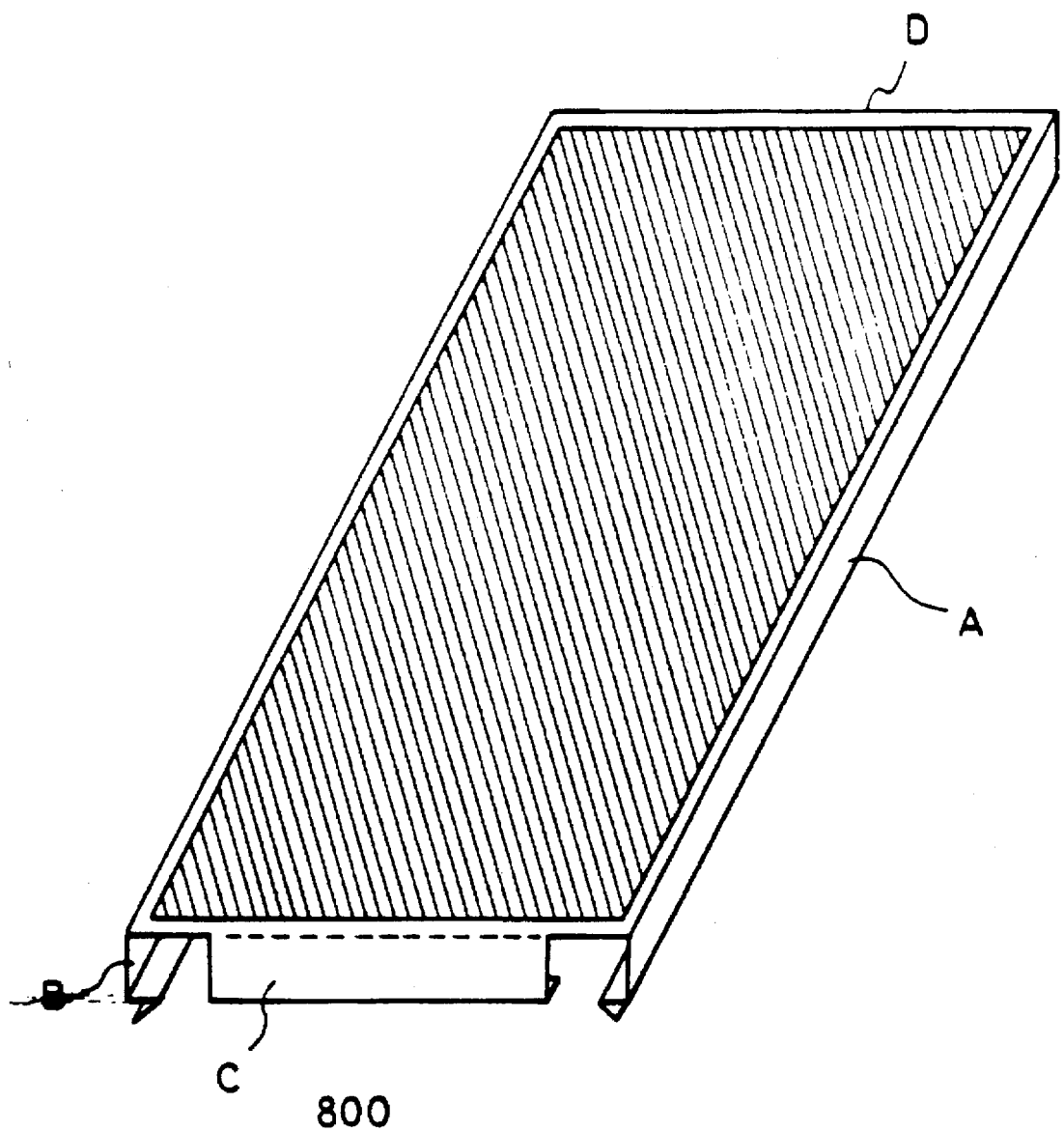
FIG. 8 is a perspective view of one embodiment of a solar cell module according to the present invention.

The solar cell module 700 (FIG. 7) was bent by a bending machine in the direction opposite to the surface to be illuminated with the sunlight, that is, in the direction opposite to the non-extended fluorine resin film, as shown in FIG. 8.

The bending was done at portions outside both the solar cell element portion and the non-woven glass cloth, in such a manner that a fixture made of a urethane resin was disposed on the bending machine and the solar cell module was placed on the fixture such that the surface of the solar cell module came in contact with the fixture, and then the bending was done, thereby preventing the surface of the solar cell from being damaged.

After the bending, no defects due to the bending were observed in the bent portions of the surface of the solar cell module. The check for defects was carried out as follows. Oil paint was coated with a marker on the bent portion, and then the oil paint was wiped with a solvent. Whether or not there was any oil paint remaining at defects was checked. The bent solar cell module 800 was installed on a roof, as shown in FIG. 9. IN FIG. 9, reference numeral 920 denotes a roofing board, and reference numeral 910 denotes a receiving element for receiving the solar cell module, the receiving element being fixed to the roofing board. The bent solar cell module 800 was first placed on the receiving element, and then fitted into the receiving element 910 by pressing the solar cell module downward. One end of another solar cell module 810 adjacent to the solar cell module 800 was also fitted into the same receiving element 910 as that into which the solar cell module 800 was fitted. In this installation technique, the bent solar cell modules can be easily fitted into the receiving elements one after another, whereby the solar cell module can be easily installed on a roof.

The reliability of the bent solar cell module 800 was evaluated from the variations in the characteristics of the solar cell after subjecting the solar cell module 800 to the sunlight at a high temperature and a high humidity. That is, the solar cell module 800 was placed in environmental testing equipment, and the surface of the solar cell module was continuously illuminated with light from a fluorescent lamp at a relative humidity of 85%, and the change in the characteristics of the solar cell module was monitored.

The variation in the characteristic of the solar cell was evaluated from the ratio of the output power of the solar cell after the environmental test to the initial value before the environmental test.

FIG. 16 shows the variations in the characteristic of the solar cell module during the environmental test with continuous light illumination at a high temperature and a high humidity. As can be seen from this figure, the solar cell module of this example according to the present invention maintained excellent characteristics without showing a reduction in the output power after the illumination at a humidity of 85%.

COMPARISON EXAMPLE 1

Figure 17B:
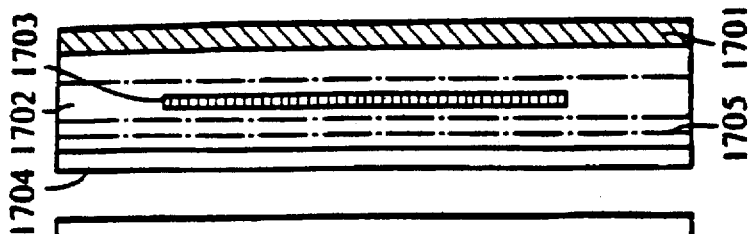
FIGS. 17(b) and 17(c) are cross-sectional views thereof.
Figure 17A:
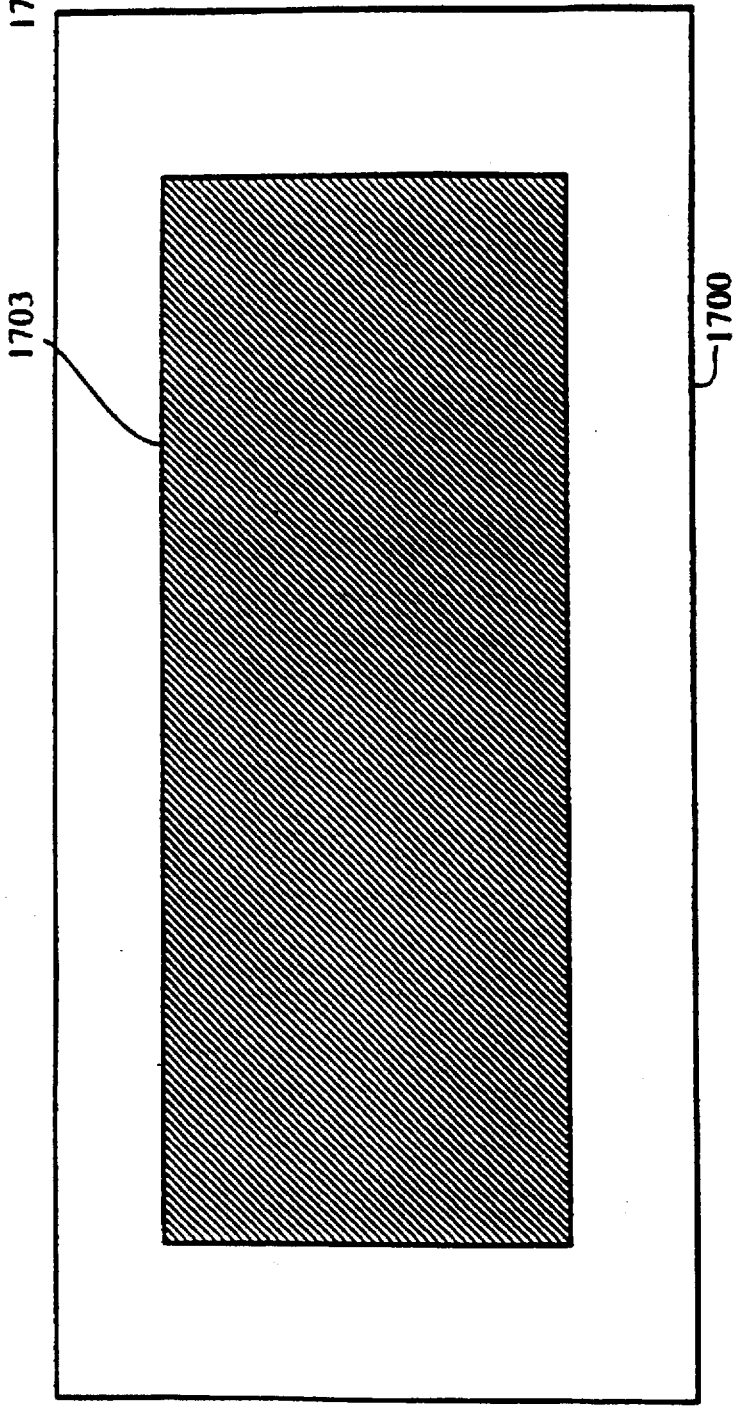
FIG. 17(a) is a plan view of a laminated solar cell module for comparison with the present invention.
Figure 17C:
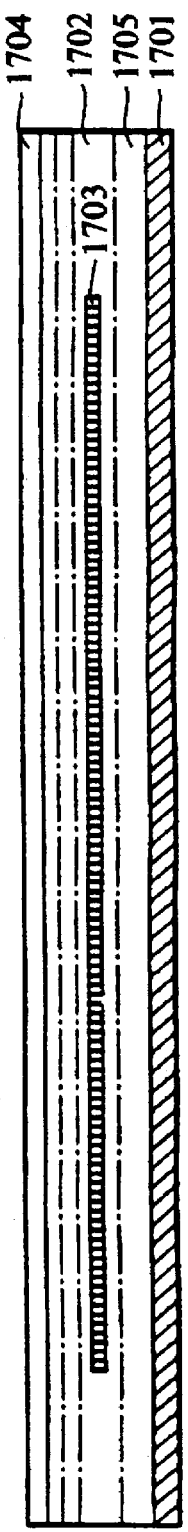

For comparison with the solar cell module of the present invention, a solar cell module was produced according to the following process steps, and evaluated in a similar manner to that in example 1. The solar cell module for comparison was produced as follows. The active solar cell element was produced in the same manner as that in example 1. Referring to FIG. 17, as in example 1, a 0.8 mm thick zinc-plated steel sheet 1701, 0.5 mm thick EVA sheet 1702, a 0.1 mm thick non-woven glass cloth with 95% vacancies 1705, 13 solar cell elements 1703 connected in series, EVA 1702, non-woven glass cloth, EVA 1702, a non-woven glass cloth, a 50

μm thick non-extended ethylene-tetraethylene copolymer fluorine resin film 1704 (Aflex, available from Asahi Glass Company) were placed one on another, and then heated at 150° C. for 100 min. with a vacuum laminator, thereby melting the EVA. Thus a solar cell module 1700 was obtained, wherein the solar cell module comprises the solar cell elements 1703 sandwiched between the zinc steel and the non-extended fluorine resin film, all these elements being encapsulated with the resin. In comparison example 1, the size of the non-woven glass cloth 1705 was the same as that of the zinc steel 1701 so that there was non-woven glass cloth 1705 in the bent portion at which the solar cell module would be bent in the direction opposite to the surface to be illuminated with the sunlight. Then, the solar cell module was bent in the same manner as that of example 1 shown in FIG. 9. The solar cell module 1700 was placed in environmental testing equipment, and the surface of the solar cell module was continuously illuminated with light from a fluorescent lamp at a relative humidity of 85%, and the change in the characteristics of the solar cell module was monitored. The variation in the characteristic of the solar cell was evaluated from the ratio of the output power of the solar cell after the environmental test to the initial value before the environmental test.

FIG. 16 also shows the variations in the characteristic of the solar cell module of this comparison example during the environmental test with continuous light illumination at a high temperature and at a high humidity. As can be seen from this figure, the solar cell module of this example showed a reduction in the output power after the illumination at a humidity of 85%, wherein the reduction increased with elapsing time, and the output decreased to a low level as about 60% of the initial output after 1500 hours.

From the results of example 1 and comparison example 1, it can be seen that in a solar module comprising an active solar cell element, back face reinforcing member, a filler, a filler holding element, and a weatherable and transparent film, wherein the elements other than the back face reinforcing member are disposed on the back face reinforcing member, and wherein the back face reinforcing member, the filler, and the weatherable and transparent film are bent at a portion outside the active area in the direction opposite to the surface which is illuminated with the sunlight, if there is no filler holding element at the bent portion, then the characteristics of the solar cell module can be improved drastically.

COMPARISON EXAMPLE 2

In this example for comparison, uniaxial stretched fluorine resin film was employed for the fluorine resin film in example 1. More specifically, a 38 μm thick "Tefzel" film (available from Du Pont Company) was used. The allowable maximum extension ratios without breakage were 45% for the longitudinal direction, and 650% for the lateral direction (according to the test standard of ASTM-D882). A solar cell module was produced in the same manner as that in example 1 except that the surface fluorine resin film was replaced with that described above. The produced solar cell was bent, and then installed on a roof, in the same manner as that in example 1. The fluorine resin film was disposed such that the longitudinal direction of the fluorine resin film was coincident with the longitudinal direction of the solar cell module. The bending was performed using a bending machine with a fixture made of urethane, in the same manner as that in example 1. The bending was successful for the bent portions along sides A and B in FIG. 8. However, large cracks were introduced in the fluorine resin film in the bent portions along sides C and D corresponding to the small maximum extension ratio of 60%.

EXAMPLE 2

Figure 10:
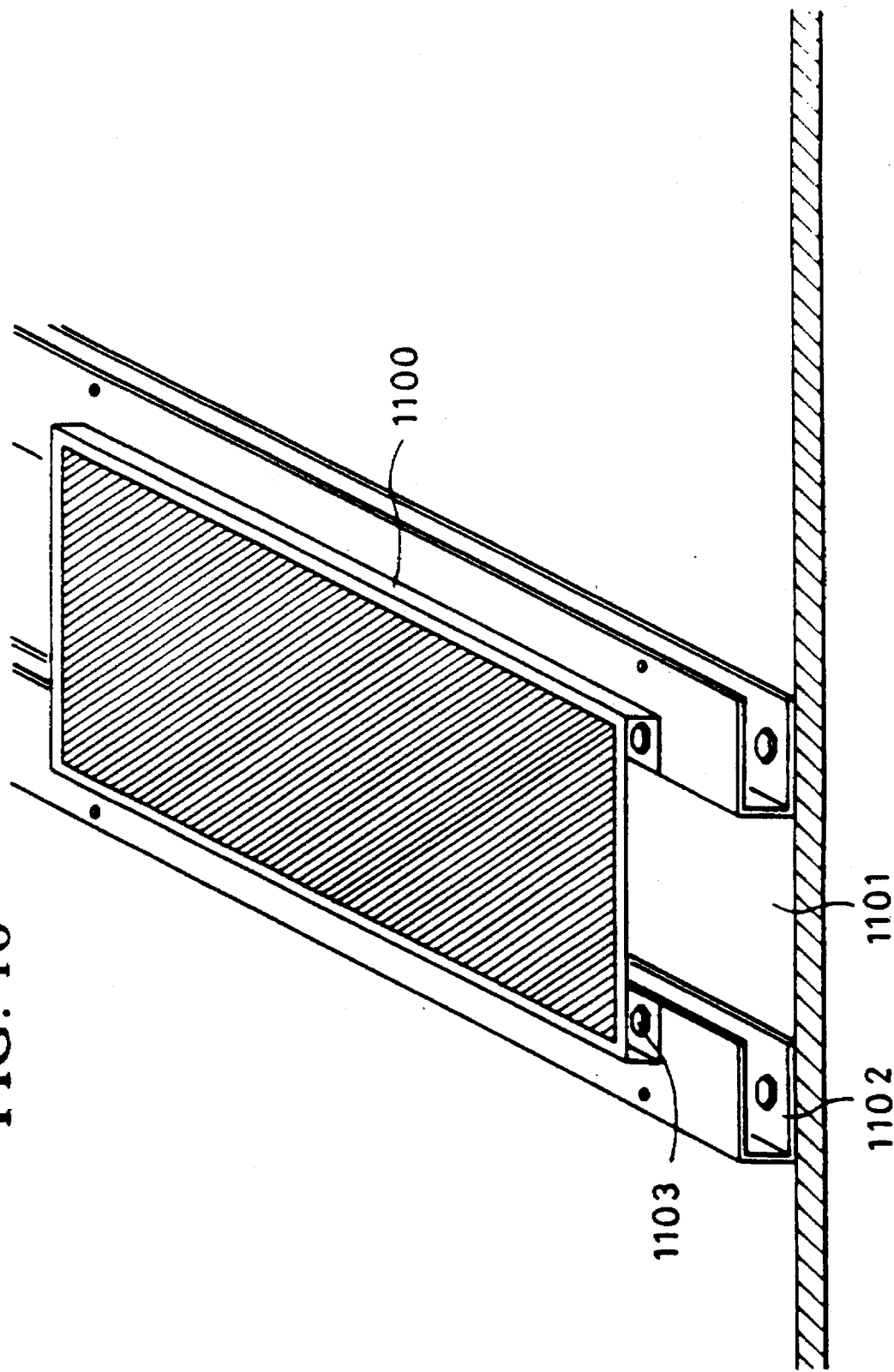
FIG. 10 is a schematic representation of a method of installing a solar cell module according to another embodiment of the present invention.

In this example, a solar cell module 1100 produced in the same manner as that in example 1 was bent only along two sides as shown in FIG. 10, and then fixed to fixing base elements 1102 with bolts 1103, wherein the fixing base elements 1102 were fixed onto a roofing board 1101. In this example, the end portions of the solar cell module are bent in the direction opposite to the surface illuminated with the sunlight, whereby the solar cell module has no aluminum frame, and thus has a light weight, and can be easily installed.

EXAMPLE 3

In this example, a solar cell module 1110 produced in the same manner as that in example 1 was bent along four sides as shown in FIGS. 11(a)–11(c), and then the solar cell module 1110 was installed by inserting part of the bent portion into the spaces between fixing base element 1120 and holding plate 1130 mounted on the fixing base element with screws. The holding plate 1130 was designed such that one end of the holding plate 1130 floats above the fixing base element 1120.

In this example, the solar cell module can be easily bent, and easily installed with fixing base elements having a simple structure.

EXAMPLE 4

FIG. 12 illustrates the structure of a solar cell module of this example. In FIG. 12, reference numeral 1200 denotes a solar cell module whose sides along the longitudinal direction are bent while keeping the other sides unbent, wherein the solar cell module 1200 has a cut-out portion 1230 for engaging a hook provided in a receiving base element.

In this example, a solar cell module was produced in the same manner as that in example 1 so that the solar cell module had the same layer structure as that in example 1.

Then, four cut-out portions 1230 were formed in both sides which lie along the longitudinal direction. After that, both sides of the solar cell module were bent with a bending machine. As in example 1, no cracks were observed in the surface fluorine resin film made of "Aflex" after bending.

The solar cell module 1200 was placed on the receiving base elements 1210 such that the cut-out portions 1230 engaged the hooks 1220, and then the solar cell module was slid downward so as to install the solar cell module on the receiving base elements 1210.

In this example, the solar cell module is bent in the direction opposite to the surface illuminated with the sunlight, and has cut-out portions, whereby the solar cell module can be easily installed.

EXAMPLE 5

Figures 13A, 13B:
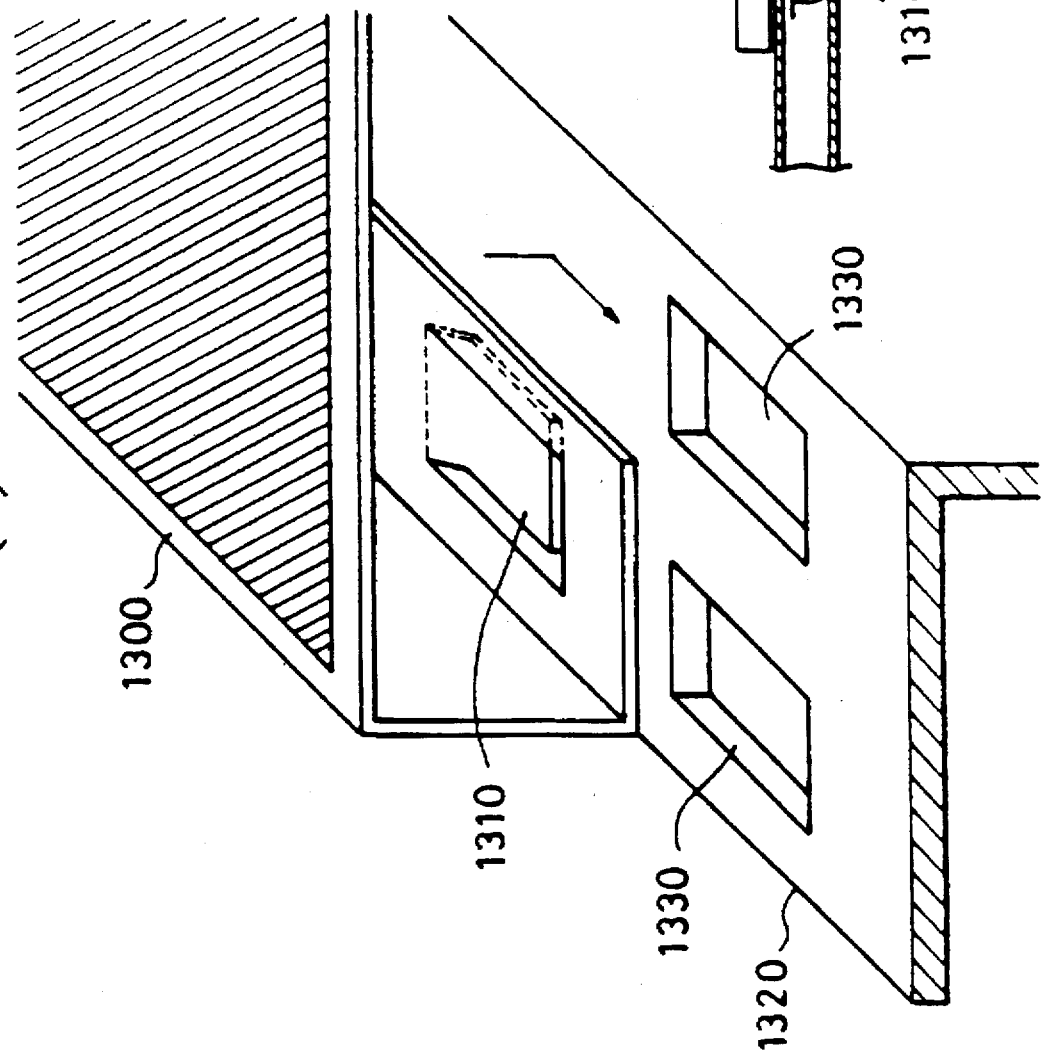
FIG. 13(a) is a schematic diagram illustrating a method of installing a solar cell module according to still another embodiment of the present invention.
FIG. 13(b) is a cross-sectional view illustrating an installing portion of the solar cell module according to the above embodiment.

In this example, a solar cell module was bent in such a manner as that shown in FIG. 13, and tabs were formed on the lower faces of the bent portions at four corners. The tabs were fitted into cut-out portions 1330 in fixing base elements, and then the solar cell module was moved slightly, thereby installing the solar cell module on the fixing base elements. The solar cell module used in this example was produced in the same manner as that in example 1 so that the solar cell module had the same layer structure as that in example 1. In this example, the solar cell module can be easily installed without using screws or other additional installation elements, whereby it is possible to reduce the installation cost.

EXAMPLE 6

Figure 18:
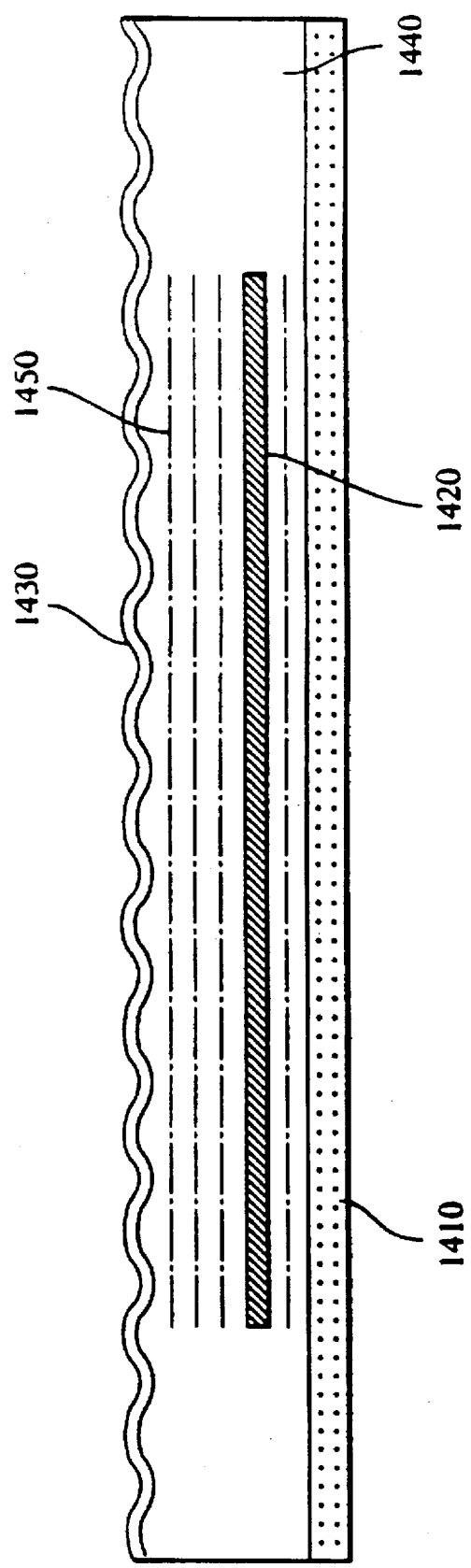
FIG. 18 is a cross-sectional view of a laminated solar cell module whose surface has irregularities, for use in the present invention.
Figure 19:
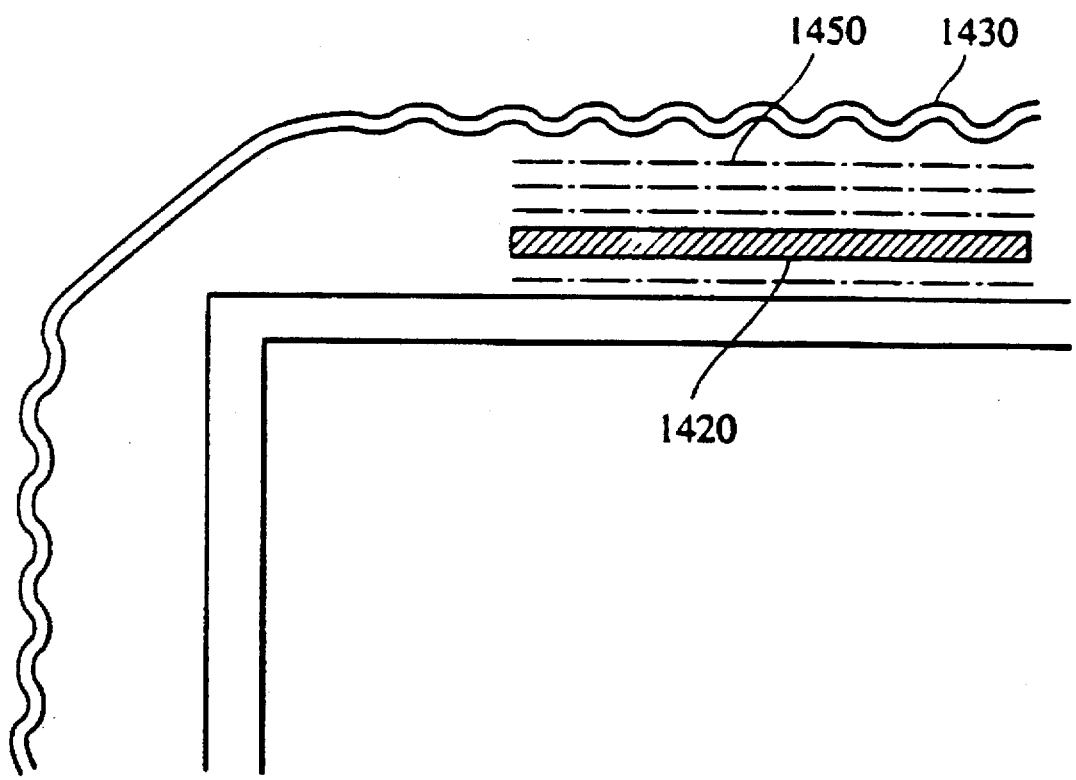
FIG. 19 is an enlarged fragmentary cross-sectional view of a bent portion of the solar cell module of FIG. 18.

In this example, a solar cell module was produced in the same manner as that in example 1 except that irregularities were formed on the surface of the solar cell module so as to enhance the adhesive strength between the weatherable and transparent film and the EVA. The solar cell module was bent into the same form as that in example 1. FIG. 18 illustrates a cross section of the solar cell module before it was bent, and FIG. 19-1 illustrates a cross section of the solar cell module shown in FIG. 18 after it was bent in the same form as in example 1. The irregularities on the surface of the solar cell module were formed by pressing a 16×18 aluminum wire mesh having a thickness of 300 μm onto the weatherable and transparent film during the vacuum heating process.

EXAMPLE 7

In this example, as in example 6, irregularities were also formed on the surface of the solar cell module so as to enhance the adhesive strength between the weatherable and transparent film and EVA. The irregularities on the surface of the solar cell module were formed by pressing a 40×40 aluminum wire mesh having a thickness of 200 μm onto the weatherable and transparent film during the vacuum heating process. The solar cell module in this example was produced in the same manner as in example 6 except that a non-woven glass cloth serving as a filler holding element was disposed on the surface side as well as on the back surface side in the entire area except for the bent portions as in the embodiment shown in FIG. 15(b). The solar cell module was bent into the same form as that in the embodiment shown in FIG. 15(b). This solar cell module was subjected to the light illumination at a high temperature at a high humidity as in example 1, and the change in the characteristic of the solar cell was monitored. FIG. 16 also shows the variations in the characteristic of the solar cell module of this example during the environmental test with continuous light illumination at a high temperature and at a high humidity. As can be seen from this figure, the solar cell module of this example, having irregularities on its surface, maintained excellent characteristics without showing a reduction in the output power after the illumination at a humidity of 85%.

EXAMPLE 8

In this example, as in example 6, irregularities were also formed on the surface of the solar cell module so as to enhance the adhesion strength between the weatherable and transparent film and the EVA. The irregularities on the surface of the solar cell module were formed by pressing a 16×18 aluminum wire mesh having a thickness of 300 μm onto the weatherable and transparent film during the vacuum heating process. The solar cell module in this example was produced in the same manner as in example 6 except that a non-woven glass cloth serving as a filler holding element was disposed on the surface side only over the active solar cell portion in the area other than the bent portions as in the embodiment shown in FIG. 15(d). The solar cell module was bent into the same form as that in the embodiment shown in FIG. 15(d). This solar cell module was subjected to the light illumination at a high temperature at a high humidity as in example 1, and the change in the characteristic of the solar cell was monitored. FIG. 16 also shows the variations in the characteristic of the solar cell module of this example during the environmental test with continuous light illumination at a high temperature and at a high humidity. As can be seen from this figure, the solar cell module of this example, having different irregularities on its surface, maintained excellent characteristics without showing a reduction in the output power after the illumination at a humidity of 85%.

COMPARISON EXAMPLE 3

In this example, a solar cell module was produced in the same manner as that in example 8 except that a non-woven glass cloth was disposed in the entire area including the bent portions. The solar sell was bent in the same form as that in example 8 and the change in the characteristic of the solar cell was evaluated in the same manner as in that in example 8. FIG. 16 also shows the variations in the characteristic of the solar cell module of this comparison example during the environmental test with continuous light illumination at a high temperature and at a high humidity. As can be seen from this figure, the solar cell module of this example showed a reduction in the output power after the illumination at a humidity of 85%, wherein the reduction increased with elapsing time, and the output decreased to a low level of about 50% of the initial output after 1500 hours.

As described above, the present invention provides a solar cell module comprising a back face reinforcing member, an active solar cell element, a filler, a filler holding element, and weatherable and transparent film, wherein the elements other than the back face reinforcing member are disposed on the back face reinforcing member, and wherein the solar cell module is characterized in that the back face reinforcing member, the filler, and the weatherable and transparent film are bent at a portion outside the active area in the direction opposite to the surface which is illuminated with the sunlight, thereby increasing the structural strength of the solar cell module. The solar cell module according to this embodiment shows excellent characteristics without long-term degradation in the conversion efficiency.

What is claimed is:

1. A roof member comprising an active solar cell element, and a filler holding element disposed on said active solar cell element, said active solar cell element and said filler holding element being encapsulated with a filler between a transparent film and a reinforcing member, wherein aid reinforcing member, said filler and said transparent film are bent in a direction opposite to a surface of the roof member to be illuminated by sunlight, and wherein there is no filler holding element at least in the bent portion.

2. A roof member according to claim 1, wherein said transparent film is a fluorine resin film.

3. A roof member according to claim 1, wherein the allowable maximum extension ratio of said transparent film is greater than 250%.

4. A roof member according to claim 1, wherein irregularities are provided on the surface of said transparent film.

5. A roof member according to claim 1, wherein said reinforcing member is made of a metal or a metal alloy.

6. A roof member according to claim 5, wherein said reinforcing member is made of at least one material selected from the group consisting of stainless steel, steel, plated metal, and galvanized steel.

7. A roof member according to claim 1, wherein said active solar cell element is made of a non-single crystal silicon semiconductor formed on a stainless steel substrate.

8. A roof member according to claim 7, wherein said non-single crystal silicon semiconductor is amorphous silicon.

9. A roof member according to claim 1, wherein said filler holding element is a non-woven glass cloth or a non-woven polymer resin.

10. A roof member according to claim 1, wherein said filler includes at least one material selected from the group consisting of ethylene-vinyl acetate copolymer, polyvinyl butyral, and a silicone resin.

11. A method of installing a roof member, said roof member comprising an active solar cell element and filler holding element disposed on the active solar cell element, the active solar cell element and the filler holding element being encapsulated with a filler between a transparent film and a reinforcing member, said method comprising the steps of:

bending the reinforcing member, the filler, and the transparent film in a direction opposite to a surface of the solar cell module to be illuminated with sunlight, wherein there is no filler holding element at least in the bent portion; and fixing the roof member via the bent portion.

12. A roof member comprising an active solar cell element and a filler holding element disposed on said active solar cell element, said active solar cell element and said filler holding element being encapsulated with a filler between a transparent film and a reinforcing member, wherein said reinforcing member, said filler and said transparent film are bent, and wherein there is no filler holding element at least in the bent portion.

13. A roof member according to claim 12, wherein said transparent film is a fluorine resin film.

14. A roof member according to claim 12, wherein the allowable extension ratio of said transparent film is greater than 250%.

15. A roof member according to claim 12, wherein irregularities are provided on the surface of said transparent film.

16. A roof member according to claim 12, wherein said reinforcing member is made of a metal or a metal alloy.

17. A roof member according to claim 16, wherein said reinforcing member is made of at least one material selected from the group consisting of stainless steel, steel, plated metal, and galvanized steel.

18. A roof member according to claim 12, wherein said active solar cell element is made of a non-single crystal silicon semiconductor formed on a stainless steel substrate.

19. A roof member according to claim 18, wherein said non-single crystalline silicon semiconductor is amorphous silicon.

20. A roof member according to claim 12, wherein said filler holding element is a non-woven glass cloth or a non-woven polymer resin.

21. A roof member according to claim 12, wherein said filler includes at least one material selected from the group consisting of ethylene-vinyl acetate copolymer, polyvinyl butyral, and a silicone resin.

22. A method of installing a roof member, said roof member comprising an active solar cell element and a filler holding element disposed on the active solar cell element, the active solar cell element and the filler holding element being encapsulated with a filler between a transparent film and a reinforcing member, said method comprising the steps of:

bending the reinforcing member, the filler and the transparent film, wherein there is no filler holding element at least in the bent portion; and fixing the roof member via the bent portion.

* * * * *

UNITED STATES PATENT AND TRADEMARK OFFICE
CERTIFICATE OF CORRECTION

PATENT NO. : 5,697,192

DATED : December 16, 1997

INVENTOR(S): YUJI INOUE

It is certified that error appears in the above-identified patent and that said Letters Patent is hereby corrected as shown below:

COLUMN 1

Line 22, "green house" should read --greenhouse--.

COLUMN 2

Line 6, "shock,," should read --shock,--;
Line 22, "which" should read --while--.

COLUMN 3

Line 33, "filler, holding" should read --filler holding--.

COLUMN 5

Line 35, "FIGS. 16" should read --FIG. 16--.

UNITED STATES PATENT AND TRADEMARK OFFICE
CERTIFICATE OF CORRECTION

PATENT NO. : 5,697,192

DATED : December 16, 1997

INVENTOR(S): YUJI INOUE

Page 2 of 2

It is certified that error appears in the above-identified patent and that said Letters Patent is hereby corrected as shown below:

COLUMN 6

Line 11, the entire line should be deleted;
Line 12, "enough" should be deleted.

COLUMN 16

Line 39, "aid" should read --said--.

Signed and Sealed this

Fourteenth Day of July, 1998

Attest:

BRUCE LEHMAN

*Attesting Officer*     *Commissioner of Patents and Trademarks*